(12) United States Patent
Kinoshita

(10) Patent No.: US 8,361,637 B2
(45) Date of Patent: Jan. 29, 2013

(54) ORGANIC ELECTROLUMINESCENT DEVICE INCLUDING SUBSTITUTED N-PHENYLCARBAZOLE-CONTAINING COMPOUND

(75) Inventor: Ikuo Kinoshita, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 399 days.

(21) Appl. No.: 12/751,066

(22) Filed: Mar. 31, 2010

(65) Prior Publication Data

US 2010/0244676 A1     Sep. 30, 2010

(30) Foreign Application Priority Data

Mar. 31, 2009   (JP) ................................. 2009-088523

(51) Int. Cl.
*H01L 51/54*   (2006.01)
*C09K 11/00*   (2006.01)

(52) U.S. Cl. ........ 428/690; 428/917; 313/504; 313/506; 257/40; 257/103; 252/301.16

(58) Field of Classification Search .................. None
See application file for complete search history.

(56) References Cited

U.S. PATENT DOCUMENTS

| | | | |
|---|---|---|---|
| 2007/0009759 A1* | 1/2007 | Burn et al. ..................... | 428/690 |
| 2009/0058279 A1* | 3/2009 | Takeda .......................... | 313/504 |
| 2009/0096356 A1* | 4/2009 | Murase et al. ................. | 313/504 |
| 2009/0218938 A1* | 9/2009 | Takeda et al. ................. | 313/504 |
| 2010/0231123 A1* | 9/2010 | Otsu et al. ..................... | 313/504 |

FOREIGN PATENT DOCUMENTS

| | | |
|---|---|---|
| JP | 08-060144 A | 3/1996 |
| JP | 08-088083 A | 4/1996 |
| JP | 2003-335754 A | 11/2003 |
| JP | 2008-085079 A | 4/2008 |
| WO | WO 2007029798 A1 * | 3/2007 |
| WO | WO 2007108459 A1 * | 9/2007 |

* cited by examiner

*Primary Examiner* — Lynda Salvatore
*Assistant Examiner* — Andrew K Bohaty
(74) *Attorney, Agent, or Firm* — Morgan, Lewis & Bockius, LLP

(57) ABSTRACT

An organic electroluminescent is provided and includes: a pair of electrodes; and at least one organic layer, between the pair of electrodes, including a light emitting layer. The device comprising, in the at least one organic layer, a compound represented by formula (I):

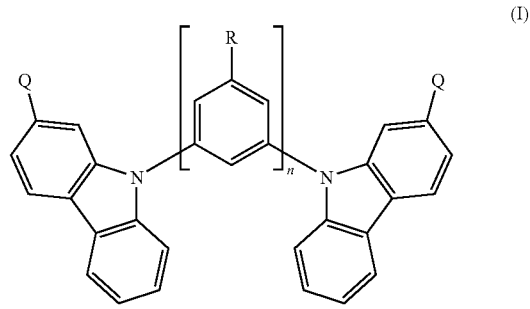

(I)

where Qs each independently represents a t-butyl group or a trimethylsilyl group; when the compound has a plurality of Rs, the Rs each independently represents a hydrogen atom, an alkyl group, a cyano group, an aryl group, or a heteroaryl group; and n stands for 1 or 2.

11 Claims, No Drawings

ORGANIC ELECTROLUMINESCENT DEVICE INCLUDING SUBSTITUTED N-PHENYLCARBAZOLE-CONTAINING COMPOUND

This application is based on and claims priority under 35 U.S.C. §119 from Japanese Patent Application No. 2009-088523, filed Mar. 31, 2009, the entire disclosure of which is herein incorporated by reference.

BACKGROUND OF THE INVENTION

1. Field of the Invention

The present invention relates to an organic electroluminescent device that converts electric energy into light and emits the light.

2. Description of the Related Art

Since organic electroluminescent devices (which may hereinafter be called "organic EL devices") are capable of emitting light of high luminance at low voltage, they have been actively researched and developed. Organic electroluminescent devices have a pair of electrodes and an organic layer therebetween and utilize, for light emission, energy of the exciton generated as a result of recombination of electrons injected from the cathode and holes injected from the anode in the organic layer.

The devices have recently had improved efficiency by using phosphorescent materials. There are disclosed inventions relating to organic electroluminescent devices that use a compound having an N-phenylcarbazole skeleton between an organic light emitting layer and a cathode to improve the adhesion with the cathode, improve the long-term storage stability, and reduce dark spots (refer to, for example, JP-A-8-88083 and JP-A-8-60144).

JP-A-2008-085079 and JP-A-2003-335754 disclose inventions relating to organic electroluminescent devices using, a light emitting layer thereof, compounds having N-phenylcarbazole skeletons represented by the following formula, respectively:

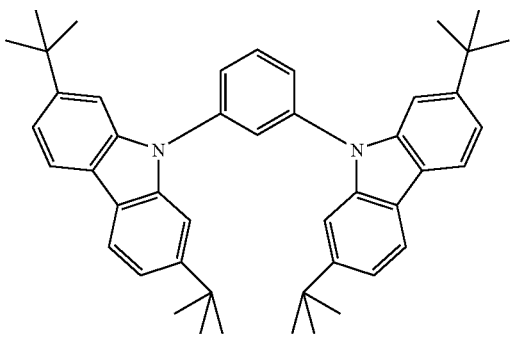

Compound described in JP-A-2008-085079

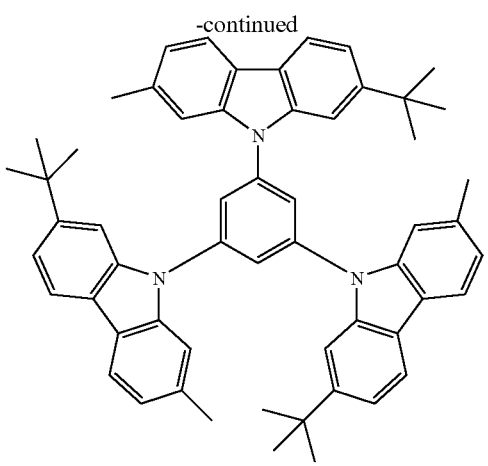

Compound described in JP-A-2003-335754

The devices using the above compounds have however insufficient durability and in addition, they need further improvement in drive voltage.

SUMMARY OF THE INVENTION

An object of an illustrative, non-limiting embodiment of the invention is to provide an organic electroluminescent device that can be driven at a low voltage, has a high luminous efficiency, and has high durability. Another object of the invention is to provide an organic electroluminescent device that emits light particularly in a blue-color region and at the same time can be driven at a low voltage, has a high luminous efficiency, and has high durability.

The invention has been achieved by the following means.

[1]

An organic electroluminescent device comprising:
a pair of electrodes; and
at least one organic layer between the pair of electrodes, the at least one organic layer including a light emitting layer,
the device comprising, in the at least one organic layer, a compound represented by formula (I):

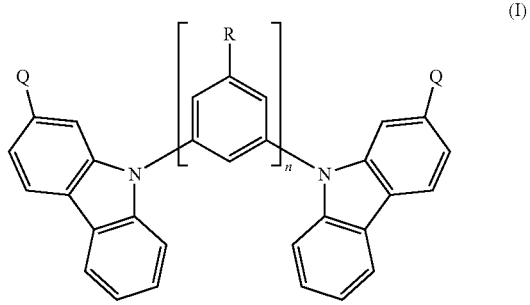

wherein Qs each independently represents a t-butyl group or a trimethylsilyl group; when the compound has a plurality of Rs, the Rs each independently represents a hydrogen atom, an alkyl group, a cyano group, an aryl group, or a heteroaryl group; and n stands for 1 or 2.

[2]

The organic electroluminescent device as described in [1], wherein the compound represented by formula (I) is a compound represented by formula (II):

(II)

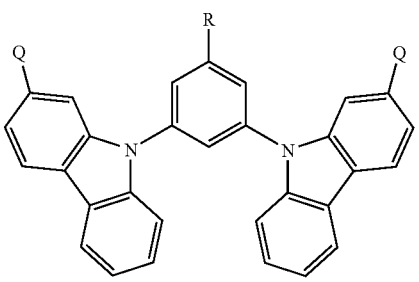

wherein Qs each independently represents a t-butyl group or a trimethylsilyl group and R represents a hydrogen atom, an alkyl group, a cyano group, an aryl group, or a heteroaryl group.

[3]

The organic electroluminescent device as described in [2], wherein the compound represented by formula (II) is a compound represented by formula (III):

(III)

wherein R represents a hydrogen atom, an alkyl group, a cyano group, an aryl group, or a heteroaryl group.

[4]

The organic electroluminescent device as described in [1], wherein the compound represented by formula (I) is a compound represented by formula (IV):

(IV)

wherein Qs each independently represents a t-butyl group or a trimethylsilyl group and Rs each independently represents a hydrogen atom, an alkyl group, a cyano group, an aryl group, or a heteroaryl group.

[5]

The organic electroluminescent device as described in [4], wherein the compound represented by formula (IV) is a compound represented by formula (V):

(V)

wherein Rs each independently represents a hydrogen atom, an alkyl group, a cyano group, an aryl group, or a heteroaryl group.

[6]

The organic electroluminescent device as described in [3], wherein R in formula (III) represents a hydrogen atom, a phenyl group, or a carbazole group.

[7]

The organic electroluminescent device as described in [5], wherein R in formula (V) represents a hydrogen atom, a phenyl group, or a carbazole group.

[8]

The organic electroluminescent device as described in any one of [1] to [7], wherein the compounds represented by formulae (I) to (V) each has a $T_1$ energy of 61 kcal/mol or greater.

[9]

The organic electroluminescent device as described in any one of [1] to [8], wherein the compounds represented by formulae (I) to (V) each has a molecular weight of from 450 to 1200.

[10]

The organic electroluminescent device as described in any one of [1] to [9], wherein the light emitting layer includes a platinum complex material.

[11]

The organic electroluminescent device as described in [10], wherein the platinum complex material has a tetradentate ligand.

[12]

The organic electroluminescent device as described in [11], wherein the platinum complex material is represented by formula (2a-1):

(2a-1)

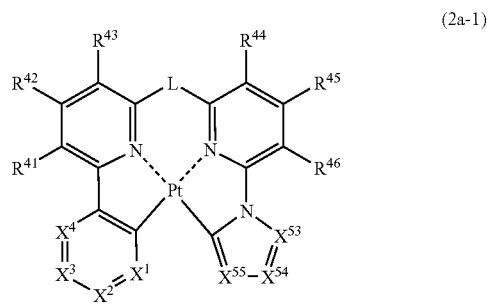

wherein $X^1$, $X^2$, $X^3$, and $X^4$ each independently represents a carbon atom or a nitrogen atom and any one or more of $X^1$, $X^2$, $X^3$, and $X^4$ represent a nitrogen atom; $R^{41}$, $R^{42}$, $R^{43}$, $R^{44}$ $R^{45}$, and $R^{46}$ each independently represents a hydrogen atom or a substituent; $X^{53}$, $X^{54}$, and $X^{55}$ each independently represents a carbon atom or a nitrogen atom and the number of nitrogen atoms contained in a 5-membered ring skeleton containing $X^{53}$, $X^{54}$, and $X^{55}$ is 1 or 2; and L represents a single bond or a divalent linking group.

[13]

The organic electroluminescent device as described in any one of [10] to [12], wherein the light emitting layer further contains a compound represented by formula (a):

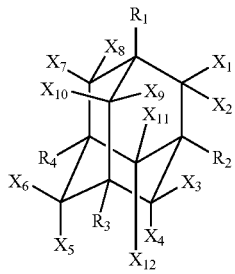

(a)

wherein $R_1$ to $R_4$ each independently represents a hydrogen atom, an alkyl group, an alkenyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group, and at least one of $R_1$ to $R_4$ represents a group with a double bond or a triple bond; and $X_1$ to $X_{12}$ each independently represents a hydrogen atom, an alkyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group.

DETAILED DESCRIPTION OF THE EXEMPLARY EMBODIMENTS

An electroluminescent device according to an exemplary embodiment of the invention is excellent in durability and can be driven at a reduced voltage. In addition, it emits light at a low drive voltage in the blue region and at the same time, has excellent durability.

Exemplary embodiments of the invention will be described. In the present specification, "$C_{k-1}$ group" means that the number of carbon atoms in the group is from k to 1.

An organic electroluminescent device according to an exemplary embodiment of the invention has a pair of electrodes and at least one organic layer including a light emitting layer between these electrodes and contains, in the at least one organic layer, a compound represented by the following formula (I):

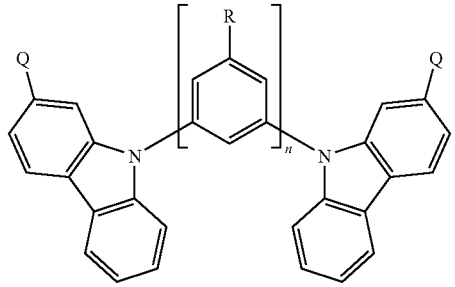

(I)

In the formula (I), Qs each independently represents a t-butyl group or a trimethylsilyl group; Rs, when the compound has a plurality of Rs, each independently represents a hydrogen atom, an alkyl group, a cyano group, an aryl group, or a heteroaryl group, and n stands for 1 or 2.

The organic electroluminescent device of the invention has, as an organic layer, at least one light emitting layer. The organic layer may have, in addition to the light emitting layer, a hole injection layer, a hole transport layer, an electron blocking layer, an exciton blocking layer, a hole blocking layer, an electron transport layer, an electron injection layer, a protective layer and the like as needed. These layers may each have a function of another layer. Each of these layers may be composed of a plurality of layers.

The organic electroluminescent device of the invention may utilize light emission from an excited singlet (fluorescence) or light emission from an excited triplet (phosphorescence). From the standpoint of luminous efficiency, the device utilizing phosphorescence is preferred.

The light emitting layer of the organic electroluminescent device of the invention is preferably composed of at least one light emitting material and at least one host material. The term "host material" as used herein means a material other than the light emitting material among the materials constituting the light emitting layer and a material having at least one of a function of dispersing a light emitting material and keeping it in the light emitting layer, a function of receiving holes from an anode, a hole transport layer, or the like, a function of receiving electrons from a cathode, an electron transport layer, or the like, a function of transporting holes and/or electrons, a function of providing a site for recombination of holes and electrons, a function of transferring the energy of an exciton produced by the recombination to the light-emitting material, and a function of transporting holes and/or electrons to the light emitting material.

The compound of the invention may be contained in any of the organic layers. It is contained preferably in a hole injection layer, a hole transport layer, an electron blocking layer, the light emitting layer, a hole blocking layer, an electron transport layer, or an electron injection layer; more preferably in the light emitting layer, a hole blocking layer, an electron transport layer, or an electron injection layer; particularly preferably in the light emitting layer; most preferably in the light-emitting layer as a host material. When the compound of the invention is contained as a host material in the light-emitting layer, the content of it in the light emitting layer is preferably from 50 mass % (weight %) to 99.9 mass %, more preferably from 60 mass % to 98 mass %. When the compound of the invention is contained in the hole injection layer, hole transport layer, electron blocking layer, hole blocking layer, electron transport layer, or electron injection layer, the content of the invention compound in each layer is preferably from 70 mass % to 100 mass %, more preferably from 85 mass % to 100 mass %, most preferably from 99 mass % to 100 mass %.

It is only necessary that the compound of the invention be contained in at least one organic layer but the compound may also be contained in two or more organic layers.

The compound represented by the following formula (I) will next be described.

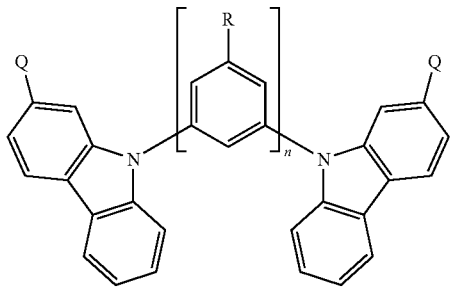

In the formula (I), Qs each independently represents a t-butyl group or a trimethylsilyl group; Rs, when the compound has a plurality of Rs, each independently represents a hydrogen atom, an alkyl group, a cyano group, an aryl group, or a heteroaryl group; and n stands for 1 or 2.

When a carbazole-containing compound protected, at the active position thereof, with a substituent is used as a host material of an organic electroluminescent device, it can prevent decomposition. When all the active positions of the carbazole group are protected with substituents, transport of charges is disturbed, leading to a drastic increase in voltage or deterioration in durability of the device.

Using the compound represented by the formula (I) as a host material of an organic electroluminescent device can prevent decomposition because only one active position of the carbazole group of the compound is protected with the substituent Q. This means that the device has greatly improved durability when its active position is protected with a substituent without accelerating a rise in voltage or deterioration of durability.

The compound represented by the formula (I) has a structural characteristic that when n stands for 1, one of the carbazole groups is bound at the m- (meta) position relative to the other carbazole group and when n stands for 2, the carbazole group is bound at the 3,3' position of the biphenyl group.

An organic electroluminescent device with the above-described structure can have a high triplet ($T_1$) energy and even when a light emitting layer is formed using the compound and a blue phosphorescent material, the device can have a high efficiency.

Qs each independently represents a t-butyl group or a trimethylsilyl group, preferably a t-butyl group.

In the specification, the "substituent group A" is defined as below.

(Substituent Group A)

Examples of the substituent belonging to Substituent group A include alkyl groups (preferably $C_{1-30}$, more preferably $C_{1-20}$, particularly preferably $C_{1-10}$ alkyl groups such as methyl, ethyl, isopropyl, tert-butyl, n-octyl, n-decyl, n-hexadecyl, cyclopropyl, cyclopentyl, and cyclohexyl), alkenyl groups (preferably $C_{2-30}$, more preferably $C_{2-20}$, particularly preferably $C_{2-10}$ alkenyl groups such as vinyl, allyl, 2-butenyl, and 3-pentenyl), alkynyl groups (preferably $C_{2-30}$, more preferably $C_{2-20}$, particularly preferably $C_{2-10}$ alkynyl groups such as propargyl and 3-pentynyl), aryl groups (preferably $C_{6-30}$, more preferably $C_{6-20}$, particularly preferably $C_{6-12}$ aryl groups such as phenyl, p-methylphenyl, naphthyl, and anthranyl), amino groups (preferably $C_{0-30}$, more preferably $C_{0-20}$, particularly preferably $C_{0-10}$ amino groups such as amino, methylamino, dimethylamino, diethylamino, dibenzylamino, diphenylamino, and ditolylamino), alkoxy groups (preferably $C_{1-30}$, more preferably $C_{1-20}$, particularly preferably $C_{1-10}$ alkoxy groups such as methoxy, ethoxy, butoxy, and 2-ethylhexyloxy), aryloxy groups (particularly $C_{6-30}$, more preferably $C_{6-20}$, particularly preferably $C_{6-12}$ aryloxy groups such as phenyloxy, 1-naphthyloxy, and 2-naphthyloxy), heterocyclic oxy groups (preferably $C_{1-30}$, more preferably $C_{1-20}$, particularly preferably $C_{1-12}$ heterocyclic oxy groups such as pyridyloxy, pyrazyloxy, pyrimidyloxy, and quinolyloxy), acyl groups (preferably $C_{2-30}$, more preferably $C_{2-20}$/particularly preferably $C_{2-12}$ acyl groups such as acetyl, benzoyl, formyl, and pivaloyl), alkoxycarbonyl groups (preferably $C_{2-30}$, more preferably $C_{2-20}$, particularly preferably $C_{2-12}$ alkoxycarbonyl groups such as methoxycarbonyl and ethoxycarbonyl), aryloxycarbonyl groups (preferably $C_{7-30}$, more preferably $C_{7-20}$, particularly preferably $C_{7-12}$ aryloxycarbonyl groups such as phenyloxycarbonyl), acyloxy groups (preferably $C_{2-30}$, more preferably $C_{2-20}$, particularly preferably $C_{2-10}$ acyloxy groups such as acetoxy and benzoyloxy), acylamino groups (preferably $C_{2-30}$, more preferably $C_{2-20}$, particularly preferably $C_{2-10}$ acylamino groups such as acetylamino and benzoylamino), alkoxycarbonylamino groups (preferably $C_{2-30}$, more preferably $C_{2-20}$, particularly preferably $C_{2-12}$ alkoxycarbonylamino groups such as methoxycarbonylamino), aryloxycarbonylamino groups (preferably $C_{7-30}$, more preferably $C_{7-20}$, particularly preferably $C_{7-12}$ aryloxycarbonylamino groups such as phenyloxycarbonylamino), sulfonylamino groups (preferably $C_{1-30}$, more preferably $C_{1-20}$, particularly preferably $C_{1-12}$ sulfonylamino groups such as methanesulfonylamino and benzenesulfonylamino), sulfamoyl groups (preferably $C_{0-30}$, more preferably $C_{0-20}$, particularly preferably $C_{0-12}$ sulfamoyl groups such as sulfamoyl, methylsulfamoyl, dimethylsulfamoyl, and phenylsulfamoyl), carbamoyl groups (preferably $C_{1-30}$, more preferably $C_{1-20}$, particularly preferably $C_{1-12}$ carbamoyl groups such as carbamoyl, methylcarbamoyl, diethylcarbamoyl, and phenylcarbamoyl), alkylthio groups (preferably $C_{1-30}$, more preferably $C_{1-20}$, particularly preferably $C_{1-12}$ alkylthio groups such as methylthio and ethylthio), arylthio groups (preferably $C_{6-30}$, more preferably $C_{6-20}$, particularly preferably $C_{6-12}$ arylthio groups such as phenylthio), heterocyclic thio groups (preferably $C_{1-30}$, more preferably $C_{1-20}$, particularly preferably $C_{1-12}$ heterocyclic thio groups such as pyridylthio, 2-benzimidazolylthio, 2-benzoxazolylthio, and 2-benzothiazolylthio), sulfonyl groups (preferably $C_{1-30}$, more preferably $C_{1-20}$, particularly preferably $C_{1-12}$ sulfonyl groups such as mesyl and tosyl), sulfinyl groups (preferably $C_{1-30}$, more preferably $C_{1-20}$, particularly preferably $C_{1-12}$ sulfinyl groups such as methanesulfinyl and benzenesulfinyl), ureido groups (preferably $C_{1-30}$, more preferably $C_{1-20}$, particularly preferably $C_{1-12}$ ureido groups such as ureido, methylureido, and phenylureido), phosphoric acid amide groups (preferably $C_{1-30}$, more preferably $C_{1-20}$, particularly preferably $C_{1-12}$ phosphoric acid amide groups such as diethylphosphoric acid amide and phenylphosphoric acid amide), a hydroxyl group, a mercapto group, halogen atoms (such as fluorine, chlorine, bromine, and iodine), a cyano group, a sulfo group, a carboxyl group, a nitro group, a hydroxamic acid group, a sulfino group, a hydrazino group, an imino group, heterocyclic groups (preferably $C_{1-30}$, more preferably $C_{1-12}$ heterocyclic groups embracing aromatic heterocyclic groups, with the heteroatom being, for example, a nitrogen atom, an oxygen atom, a sulfur atom, a phosphorus atom, a silicon atom, a selenium atom, or a tellurium atom; and more specifically, pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, carbazolyl, azepinyl, and silolyl), silyl groups (preferably C_{3-40}, more preferably C_{3-30}, particularly preferably C_{3-24} silyl groups such as trimethylsilyl and triphenylsilyl), silyloxy groups (preferably C_{3-40}, more preferably C_{3-30}, particularly preferably C_{3-24} silyloxy groups such as trimethylsilyloxy and triphenylsilyloxy), and phosphoryl groups (such as diphenylphosphoryl and dimethylphosphoryl). These substituents may be substituted further with another substituent and the another substituent can be selected from Substituent group A described above.

In the invention, the number of carbon atoms of the substituent such as the alkyl group also applies to the case where the substituent such as alkyl group may be substituted with another substituent and the number includes the number of carbon atoms of the another substituent.

When the compound has a plurality of Rs, they each independently represents a hydrogen atom, an alkyl group, a cyano group, an aryl group, or a heteroaryl group.

Examples of the alkyl group represented by R include substituted or unsubstituted alkyl groups such as methyl, ethyl, isopropyl, tert-butyl, n-octyl, n-decyl, n-hexadecyl, cyclopropyl, cyclopentyl, and cyclohexyl. Of these, methyl, ethyl, isopropyl, tert-butyl, and cyclohexyl groups are preferred; methyl and tert-butyl groups are more preferred; and a tert-butyl group is still more preferred.

Examples of the aryl group represented by R include substituted or unsubstituted aryl groups such as phenyl, p-tolyl, m-tolyl, o-tolyl, naphthyl, cyanophenyl, and trifluoromethylphenyl. Of these, phenyl and cyanophenyl groups are preferred, with a phenyl group being still more preferred.

Examples of the heteroaryl group represented by R include substituted or unsubstituted heteroaryl groups such as nitrogen-containing 5-membered heterocycles, nitrogen-containing 6-membered heterocycles, oxygen-containing 5-membered heterocycles, and sulfur-containing 5-membered heterocycles. Specific examples include a pyridine ring, a pyrazine ring, a pyrimidine ring, a pyridazine ring, a 1,2,4-triazine ring, a 1,3,5-triazine ring, a pyrrole ring, a pyrazole ring, an imidazole ring, a 1,2,3-triazole ring, a 1,2,4-triazole ring, a furan ring, a thiophene ring, an oxazole ring, an isoxazole ring, a thiazole ring, an isothiazole ring, a 1,2,3-oxadiazole ring, a 1,2,4-oxadiazole ring, a 1,3,4-oxadiazole ring, a 1,2,3-thiadiazole ring, 1,2,4-thiadiazole ring, a 1,3,4-thiadiazole ring, a selenophene ring, a tellurophene ring, and a carbazole ring. In consideration of stability of the mother nucleus of the aromatic ring, ionization potential in a thin film, control of the electron affinity, and spread of the π electron system from the viewpoint of a charge transport property and running durability of the device, the heteroaryl group represented by R is preferably a pyridine ring, a pyrazine ring, a pyrimidine ring, a pyridazine ring, a 1,3,5-triazine ring, a pyrrole ring, a pyrazole ring, an imidazole ring, a 1,2,4-triazole ring, a furan ring, a thiophene ring, an oxazole ring, a thiazole ring, a 1,3,4-oxadiazole ring, a 1,3,4-thiadiazole ring, or a carbazole ring; more preferably a pyridine ring, a pyrazine ring, a pyrazole ring, an imidazole ring, an oxazole ring, a thiazole ring, a thiophene ring, or a carbazole ring; still more preferably a pyridine ring, a pyrazine ring, an imidazole ring, a pyrazole ring, or a carbazole ring; still more preferably a pyrazole ring or a carbazole ring; particularly preferably a carbazole ring.

In consideration of bulkiness of a substituent and electronic perturbation from the standpoint of an electron transporting property and running durability of the device, R is preferably a hydrogen atom, a phenyl group, a pyrazole ring, or a carbazole ring, more preferably a hydrogen atom, a phenyl group, or a carbazole ring, still more preferably a hydrogen atom or a phenyl group, most preferably a hydrogen atom.

In the formula (I), n stands for 1 or 2.

The compound represented by the formula (I) is preferably represented by the following formula (II). The compound represented by the formula (II) will next be described.

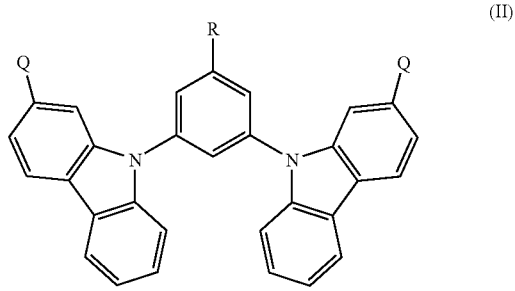

(II)

In the formula (II), Qs each independently represents a t-butyl group or a trimethylsilyl group, and R represents a hydrogen atom, an alkyl group, a cyano group, an aryl group, or a heteroaryl group.

Q and R have the same meanings as those described in the formula (I) and preferred ranges of them are also the same.

The compound represented by the formula (II) is preferably represented by the formula (III). The compound represented by the formula (III) will next be described.

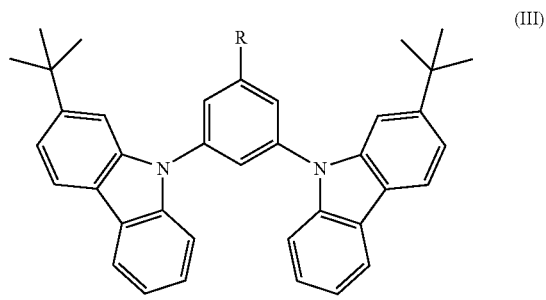

(III)

In the formula (III), R represents a hydrogen atom, an alkyl group, a cyano group, an aryl group, or a heteroaryl group.

R has the same meaning as R in the formula (I) and preferred range of it is also the same.

In another preferred mode, the compound represented by the formula (I) is represented by the following formula (IV). The compound represented by the formula (IV) will next be described.

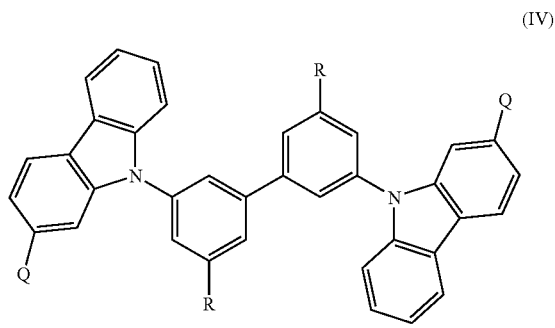

(IV)

In the formula (IV), Qs each independently represents a t-butyl group or a trimethylsilyl group, and Rs each independently represents a hydrogen atom, an alkyl group, a cyano group, an aryl group, or a heteroaryl group.

Q and R have the same meanings as those in the formula (I) and preferred ranges of them are also the same.

The compound represented by the formula (IV) is preferably represented by the formula (V). The compound represented by the formula (V) will next be described.

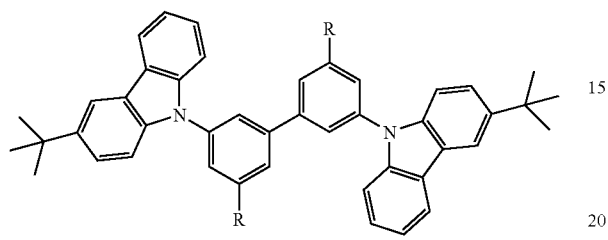

(V)

In the formula (V), R represents a hydrogen atom, an alkyl group, a cyano group, an aryl group, or a heteroaryl group.

R has the same meaning as R in the formula (I) and preferred range of it is also the same.

Although the compounds represented by the formulae (I) to (V) of the invention may be a low-molecular-weight compound, a high-molecular-weight compound having a residue connected to the polymer main chain, or a high-molecular-weight compound having, as a main chain thereof, a structure of the compound represented by the formula (I) of the invention, they are preferably a low-molecular-weight compound. The compounds represented by the formulae (I) to (V) have a molecular weight of preferably from 450 to 1200, more preferably from 500 to 1100, still more preferably from 500 to 900.

Specific examples of the compounds represented by the formulae (I) to (V) in the invention will next be shown but the present invention is not limited to them.

A-1

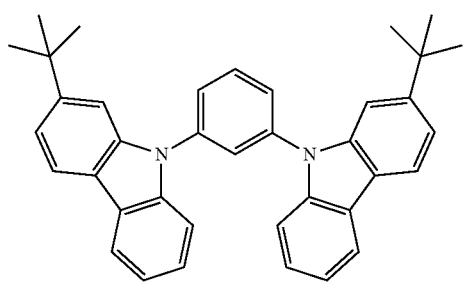

A-2

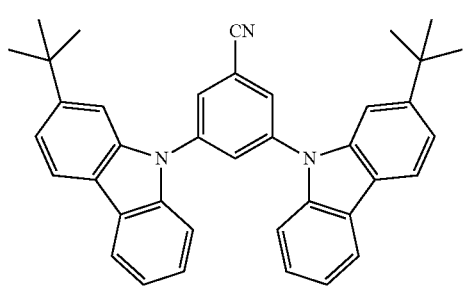

A-3

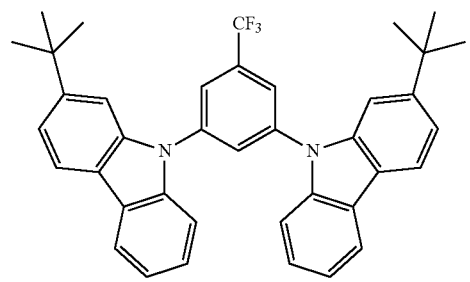

A-4

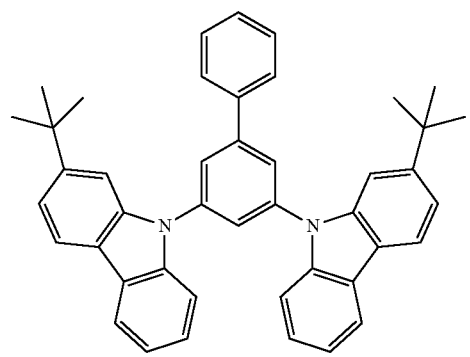

A-5

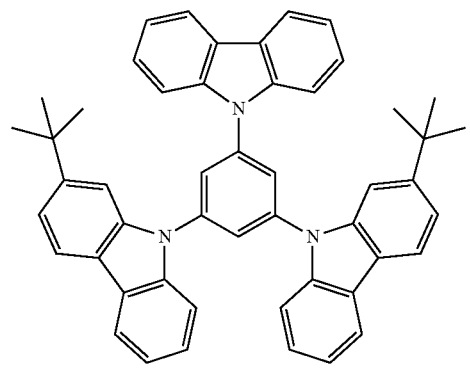

A-6

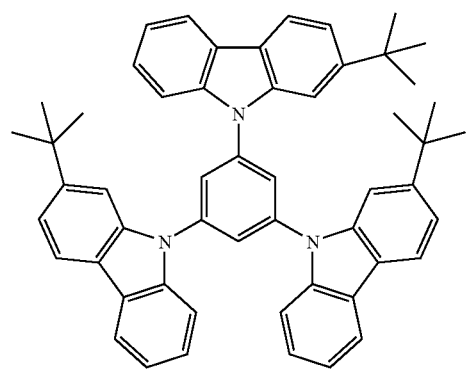

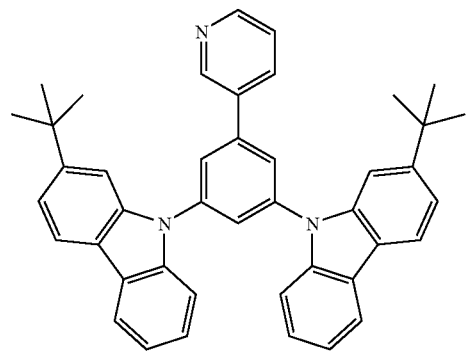
A-7
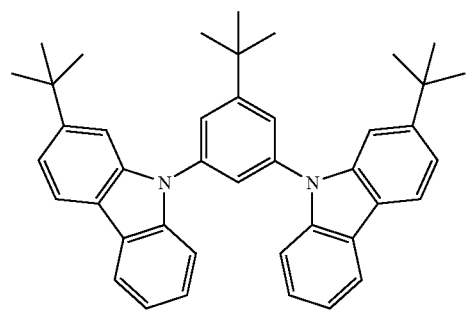
A-8
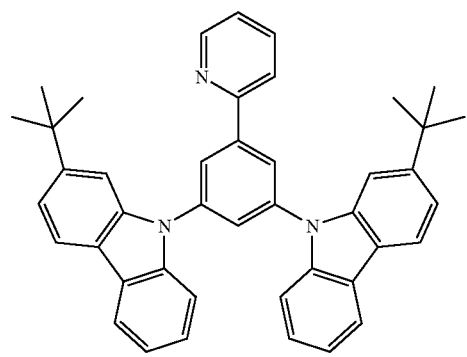
A-9
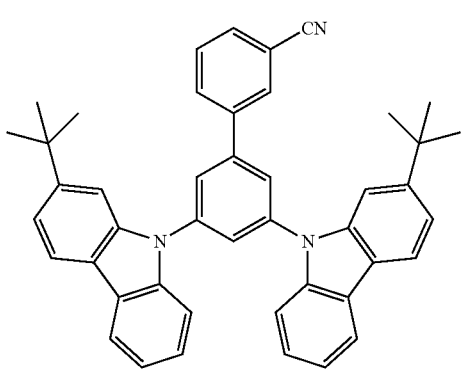
A-10
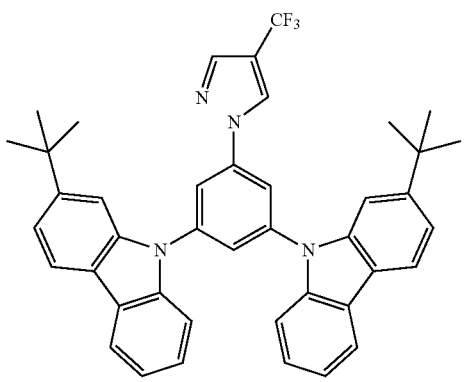
A-11
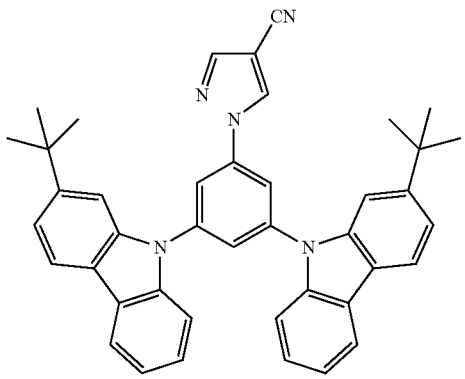
A-12
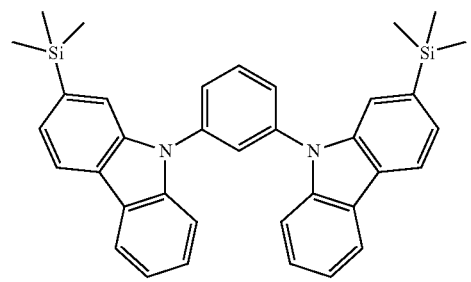
B-1
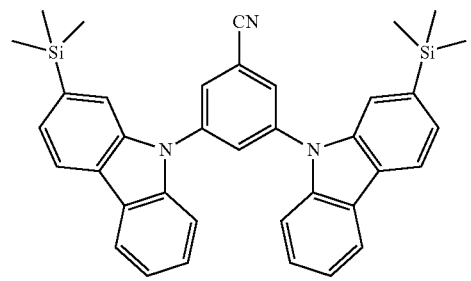
B-2
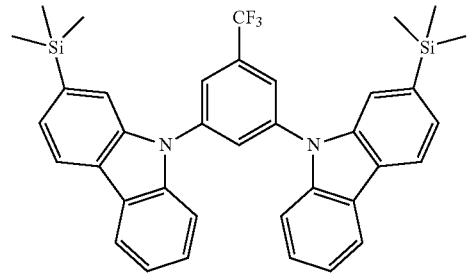
B-3

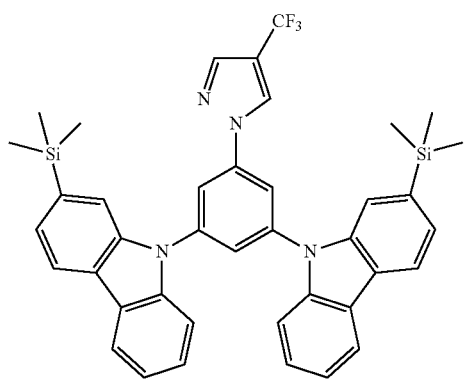
B-4
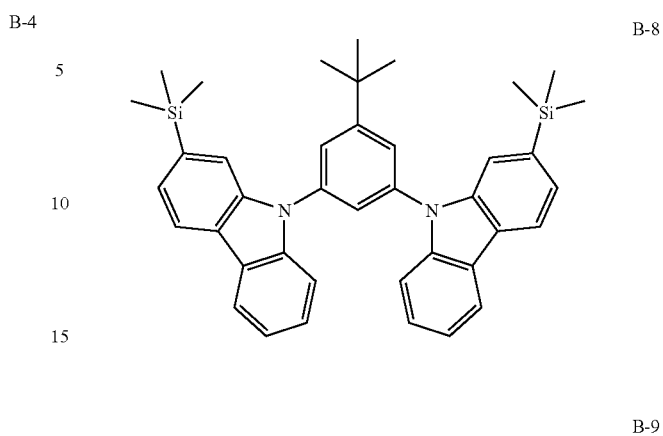
B-8
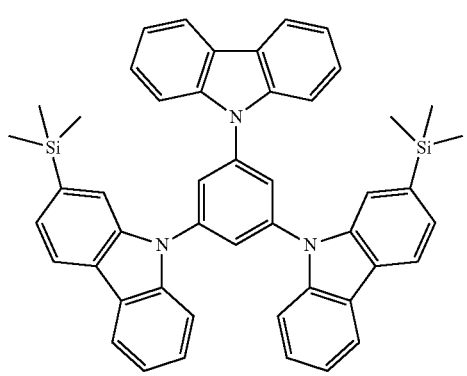
B-5
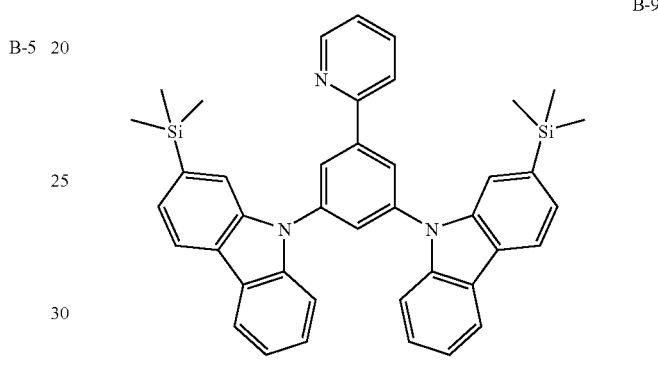
B-9
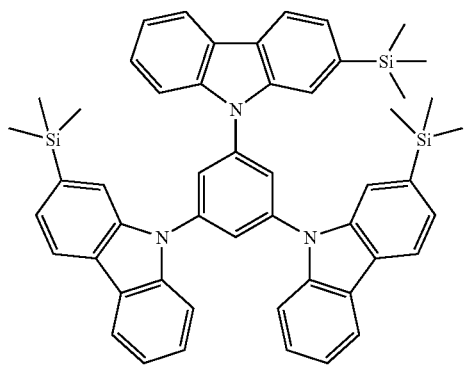
B-6
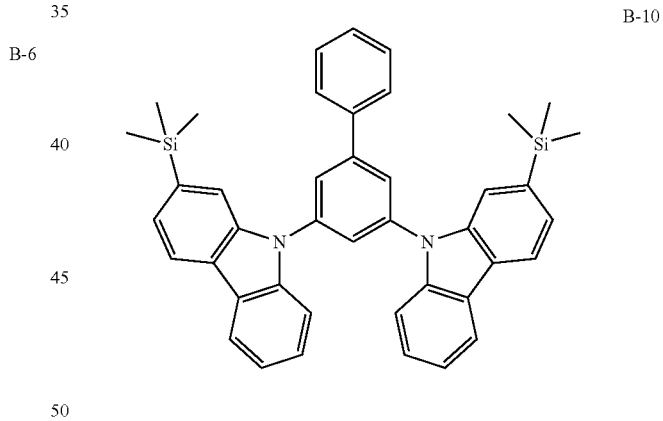
B-10
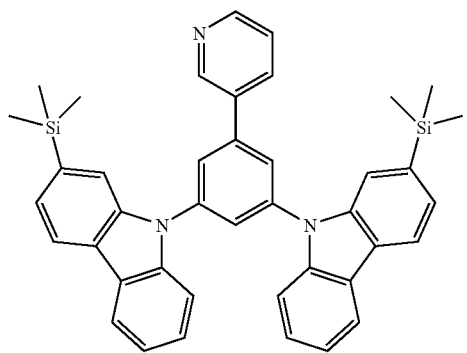
B-7
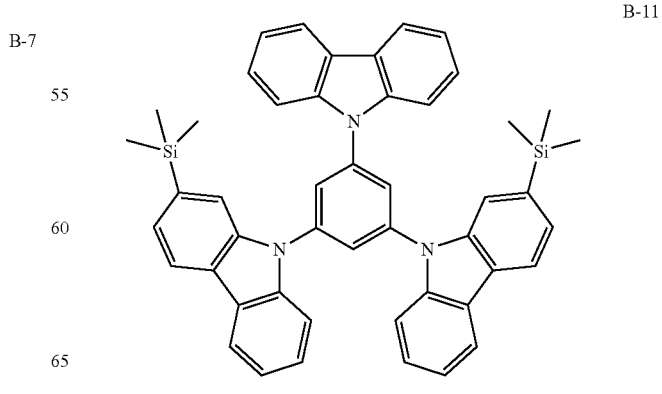
B-11

B-12
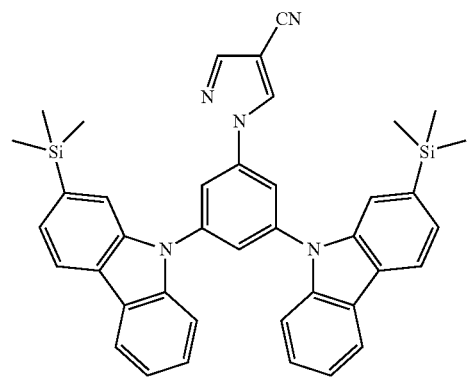
C-1
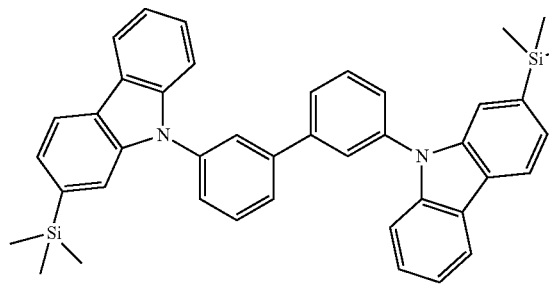
C-4
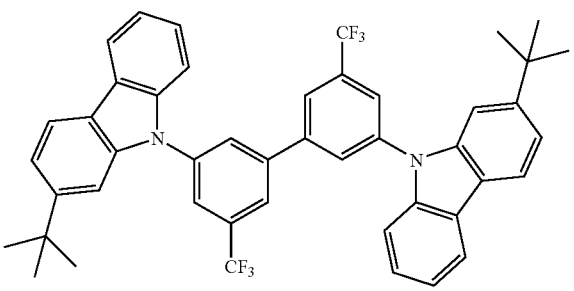
C-5
C-2
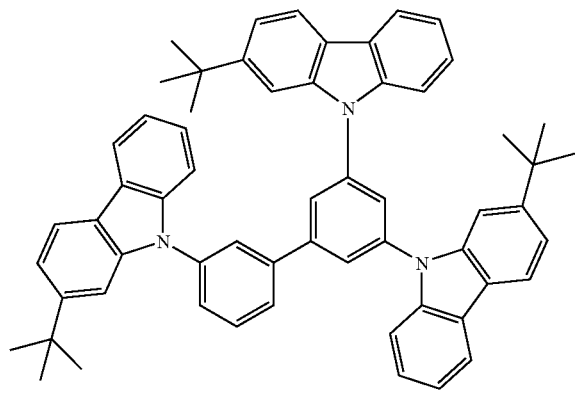
C-6
C-3
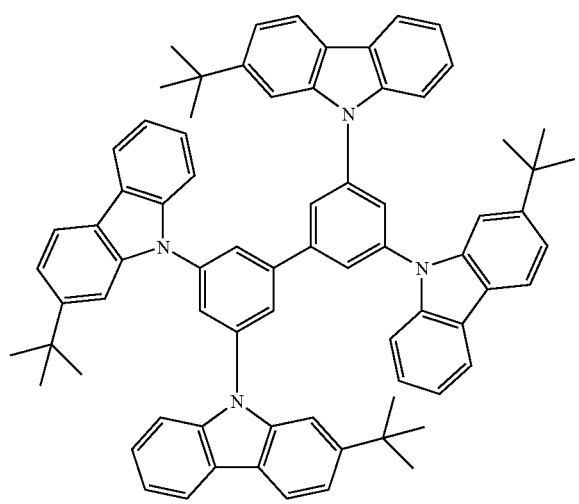
C-7

-continued
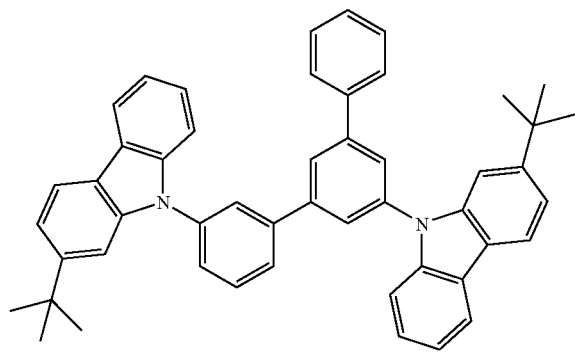
C-8
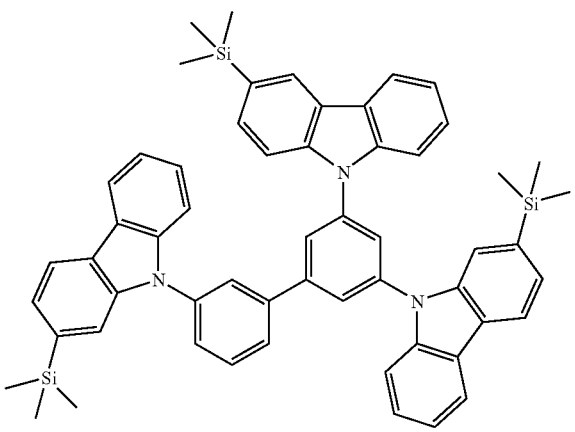
C-12
C-9
C-13
C-10
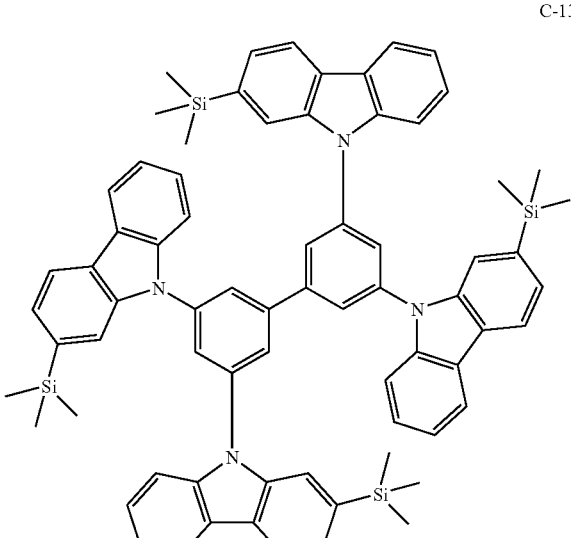
C-14
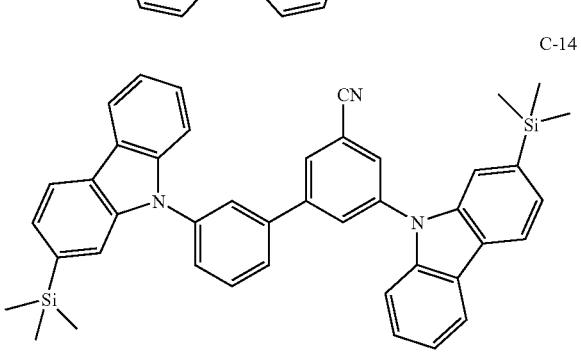
C-11
C-15
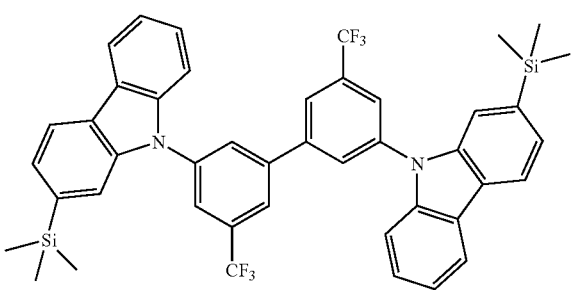

C-16
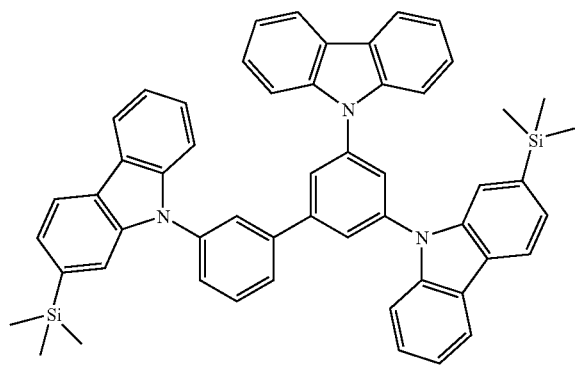
E-1
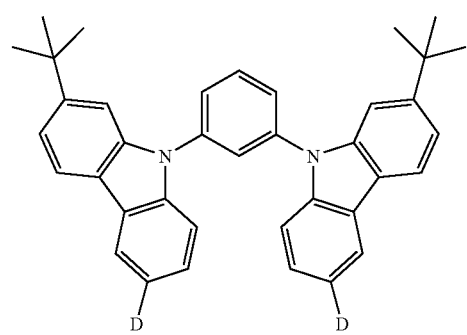
E-2
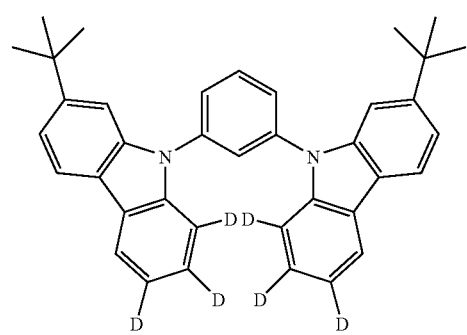
E-3
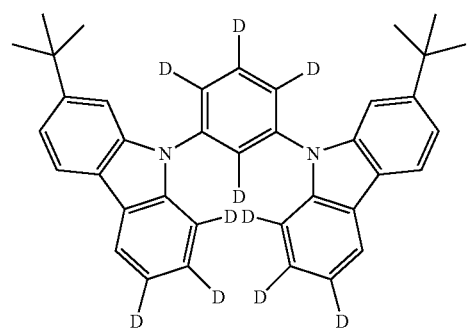
E-4
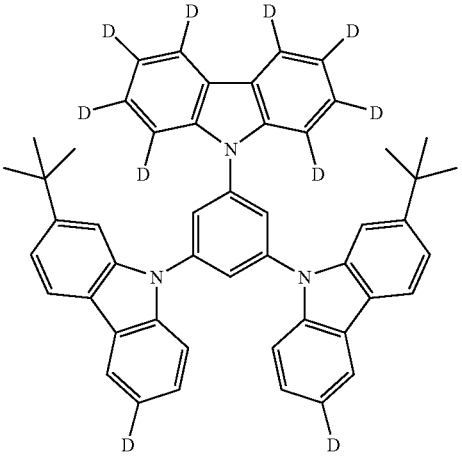
E-5
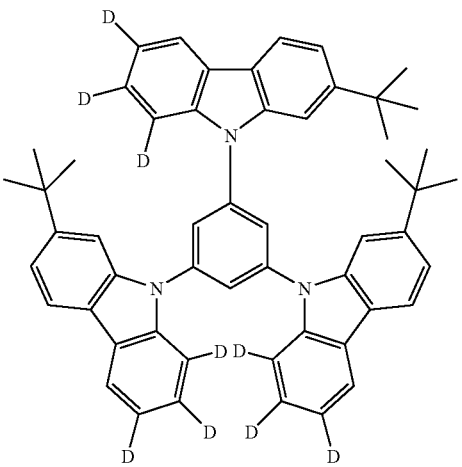
E-6
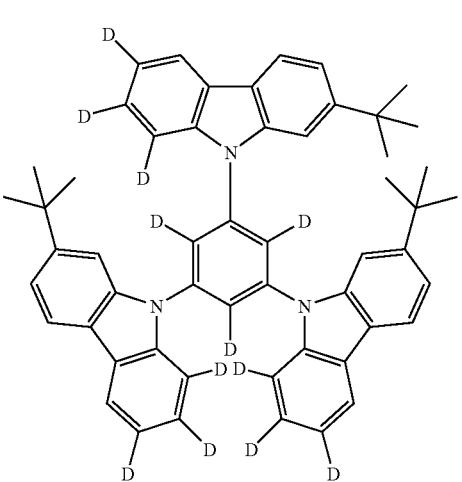

E-7

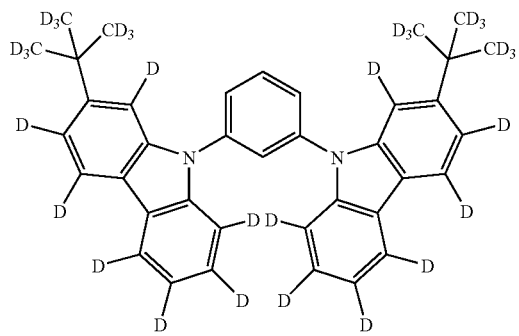

E-8

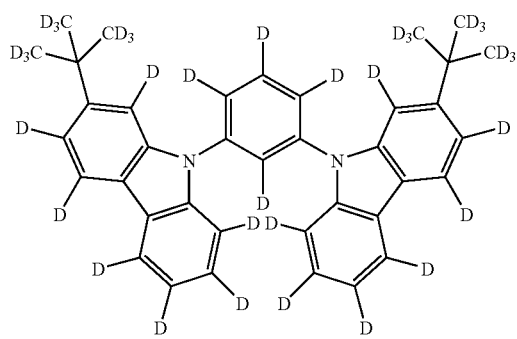

F-1

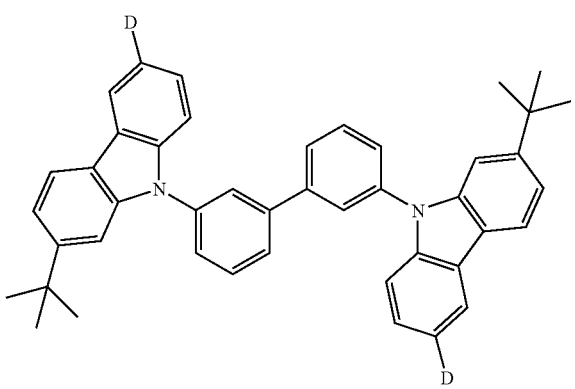

F-2

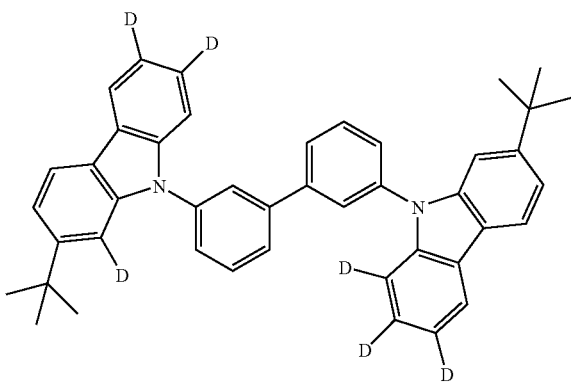

F-3

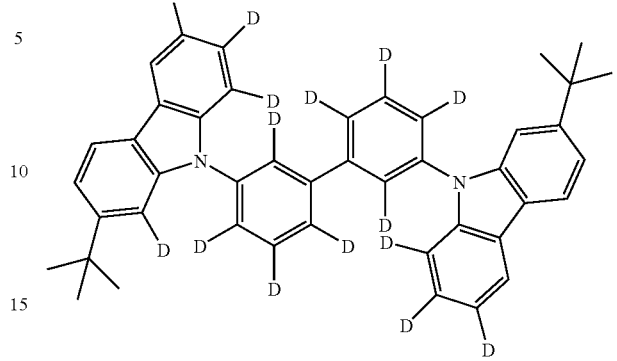

F-4

F-5

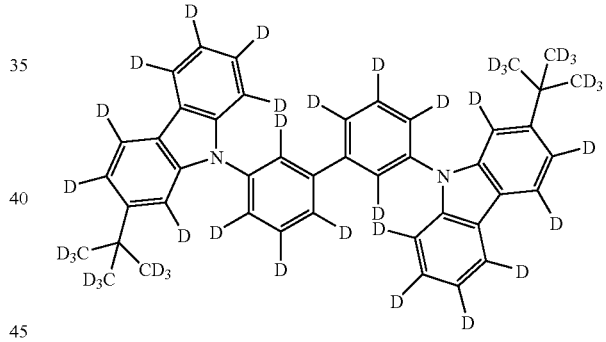

The compounds represented by the formulae (I) to (V) of the invention can be synthesized by using various known synthesis processes in combination.

When the device of the invention is a light emitting one making use of phosphorescence, the lowest excited triplet energy ($T_1$ energy) of the compound of the invention is preferably 61 kcal/mol (255.59 kJ/mol) or greater but not greater than 95 kcal/mol (398.05 kJ/mol), more preferably 63 kcal/mol (263.97 kJ/mol) or greater but not greater than 95 kcal/mol (398.05 kJ/mol), still more preferably 65 kcal/mol (272.35 kJ/mol) or greater but not greater than 95 kcal/mol (398.05 kJ/mol).

The $T_1$ energy can be determined from the short-wavelength edge of the phosphorescence spectrum of a thin film of a material. For example, a material is deposited on a cleaned quartz glass substrate by vacuum deposition to form a film having a thickness of about 50 nm and the phosphorescence spectrum of the resulting thin film is measured using "Hitachi F-7000 Fluorescence Spectrophotometer" (trade name; product of Hitachi Hi-technologies) under a liquid nitrogen temperature. The $T_1$ energy can be determined by converting the rising wavelength on the short wavelength side of the resulting emission spectrum into an energy unit.

An organic electroluminescent device containing the compound of the invention will next be described.

(Organic Electroluminescent Device)

The organic electroluminescent device of the invention preferably has at least one organic layer between a light emitting layer and a cathode and contains the compound represented by the formula (1) in the organic layer between the light emitting layer and the cathode.

The organic electroluminescent device of the invention has a cathode and an anode on a substrate and has, between these electrodes, at least one organic layer including a light emitting layer. At least one of the anode and the cathode is preferably transparent in consideration of the properties of the electroluminescent device.

In the invention, as the organic layers, a hole transport layer, a light emitting layer, and an electron transport layer are stacked in the order of mention from the anode side. Further, the device has a hole injection layer between the hole transport layer and the anode and/or an electron transporting intermediate layer between the light emitting layer and the electron transport layer. In addition, the device may have a hole transporting intermediate layer between the light emitting layer and the hole transport layer and similarly, an electron injection layer between the cathode and the electron transport layer.

Each of the organic layers may be separated into a plurality of layers.

Each layer constituting the organic layer(s) can be formed suitably by any of dry film formation methods such as vacuum deposition and sputtering, a transfer method, a printing method, a method of application, an inkjet method, and a spray method.

Elements constituting the electroluminescent device of the invention will next be described.

(Substrate)

As the substrate to be used in the invention, a substrate neither scattering nor attenuating the light emitted from the organic layer is preferred.

(Anode)

The anode may typically have a function as an electrode for supplying holes to the organic layer. No particular limitation is imposed on the shape, structure, size and the like of it. It may be selected as needed from known electrode materials, depending on the intended use or purpose of the electroluminescent device. As described above, the anode is typically provided as a transparent anode.

(Cathode)

The cathode may typically have a function as an electrode for injecting electrons to the organic layer. No particular limitation is imposed on the shape, structure, size, and the like of it. It may be selected as needed from known electrode materials, depending on the intended use or purpose of the electroluminescent device.

(Organic Layer)

The organic EL device of the invention has at least one organic layer including a light emitting layer. Examples of the organic layer other than the light emitting layer include, as described above, a hole transport layer, an electron transport layer, a charge blocking layer, a hole injection layer, and an electron injection layer.

(Light Emitting Layer)

The light emitting layer has a function of, upon application of an electric field, receiving holes from the anode, the hole injection layer, or the hole transport layer, receiving electrons from the cathode, the electron injection layer, or the electron transport layer, providing a recombination site of the holes and the electrons, and causing light emission.

Detailed description on the substrate, anode, cathode, organic layer, and light emitting layer can be found in, for example, JP-A-2008-270736 and JP-A-2007-266458 and it can be applied to the invention. The light emitting layer may contain a material having no charge transport property and not emitting light.

<Light Emitting Material>

As the light emitting material in the invention, either a phosphorescent material or a fluorescent material can be used.

The light emitting layer in the invention can contain two or more light emitting materials in order to improve color purity or widen a light emitting wavelength region, but at least one of the light emitting materials is preferably a phosphorescent material.

From the standpoint of running durability, the light emitting material in the invention preferably satisfies the following relationship between it and the host material: 1.2 eV>ΔIp>0.2 eV and/or 1.2 eV>ΔEa>02 eV wherein ΔIp means a difference in Ip between the host material and the light emitting material and ΔEa means a difference in Ea between the host material and the light emitting material.

At least one of the light emitting materials is preferably a platinum complex material or iridium complex material.

In the invention, the light emitting layer contains preferably a platinum complex material, more preferably a platinum complex material having a tetradentate ligand.

Detailed description on fluorescent materials and phosphorescent materials can be found in, for example, JP-A-2008-270736 and JP-A-2007-266458 and it can be applied to the invention.

An organic electroluminescent device containing the compound of the invention will next be described.

The platinum complex material is preferably represented by the following formula (2a-1):

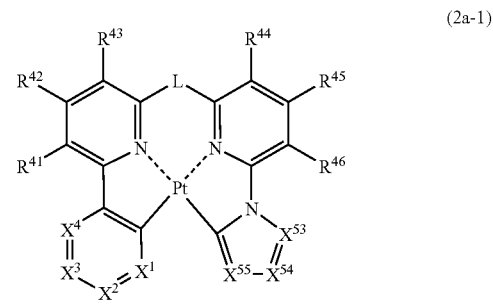

(2a-1)

In the formula (2a-1), $X^1$, $X^2$, $X^3$, and $X^4$ each independently represents a carbon atom or a nitrogen atom and any one or more of $X^1$, $X^2$, $X^3$, and $X^4$ represent a nitrogen atom; $R^{41}$, $R^{42}$, $R^{43}$, $R^{44}$, $R^{45}$ and $R^{46}$ each independently represents a hydrogen atom or a substituent; $X^{53}$, $X^{54}$, and $X^{55}$ each independently represents a carbon atom or a nitrogen atom, and the number of nitrogen atoms contained in the 5-membered ring skeleton containing $X^{53}$, $X^{54}$, and $X^{55}$ is 1 or 2; and L represents a single bond or a divalent linking group.

In the formula (2a-1), $X^1$, $X^2$, $X^3$, and $X^4$ each independently represents a carbon atom or a nitrogen atom. When $X^1$, $X^2$, $X^3$, and $X^4$ can be substituted further, they may each independently have a substituent. When $X^1$, $X^2$, $X^3$, and $X^4$ have a substituent, examples of the substituent include those belonging to Substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably an alkyl group, a perfluoroalkyl group, an aryl group, a dialkylamino group, a cyano group, or a fluorine atom, still more preferably an alkyl group, a trifluoromethyl group, or a fluorine atom. If possible, the substituents may be linked to each other to form a fused ring structure.

Any one or more of $X^1$, $X^2$, $X^3$, and $X^4$ represent a nitrogen atom. The number of nitrogen atoms is preferably 1 or 2, more preferably 1.

Although any of $X^1$, $X^2$, $X^3$, and $X^4$ represents a nitrogen atom, but it is preferred that $X^2$ or $X^3$ represents a nitrogen atom and it is more preferred that $X^3$ represents a nitrogen atom.

Examples of the 6-membered ring formed of two carbon atoms, $X^1$, $X^2$, $X^3$, and $X^4$ in the formula (2a-1) include a pyridine ring, a pyrazine ring, a pyrimidine ring, a pyridazine ring, and a triazine ring. Of these, a pyridine ring, a pyrazine ring, a pyrimidine ring, and a pyridazine ring are preferred, with a pyridine ring being particularly preferred. The 6-membered ring formed of $X^1$, $X^2$, $X^3$, and $X^4$ is advantageously a pyridine ring, a pyrazine ring, a pyrimidine ring, or a pyridazine ring (particularly preferably, a pyridine ring) because compared with a benzene ring, it facilitates formation of a metal complex due to improvement in the acidity of a hydrogen atom present at a metal-carbon bond formation position.

In the formula (2a-1), $R^{41}$, $R^{42}$, $R^{43}$, $R^{44}$, $R^{45}$ and $R^{46}$ each independently represents a hydrogen atom or a substituent. The substituent represented by $R^{41}$, $R^{42}$, $R^{43}$, $R^{44}$, $R^{45}$ or $R^{46}$ has the same meaning as that in Substituent group A. If possible, $R^{41}$, $R^{42}$, $R^{43}$, $R^{44}$, $R^{45}$ or $R^{46}$ may be coupled to each other to form a ring.

$R^{41}$ and $R^{46}$ are preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, a halogen atom, a cyano group, or a heterocyclic group, still more preferably a hydrogen atom, a methyl group, a t-butyl group, a trifluoromethyl group, a phenyl group, a fluorine atom, a cyano group, or a pyridyl group, still more preferably a hydrogen atom, a methyl group, or a fluorine atom, particularly preferably a hydrogen atom.

Preferred ranges of $R^{43}$ and $R^{44}$ are the same as those of $R^{41}$ and $R^{46}$.

$R^{42}$ and $R^{45}$ are preferably a hydrogen atom, an alkyl group, an aryl group, an amino group, an alkoxy group, an aryloxy group, an alkylthio group, an arylthio group, a halogen atom, a cyano group, or a heterocyclic group, more preferably a hydrogen atom, an alkyl group, an aryl group, an amino group, an alkoxy group, an aryloxy group, a halogen atom, or a heterocyclic group, still more preferably a hydrogen atom, an alkyl group, an amino group, an alkoxy group, a halogen atom, or a heterocyclic group, still more preferably a hydrogen atom, a methyl group, a t-butyl group, a dialkylamino group, a diphenylamino group, a methoxyl group, a phenoxy group, a fluorine atom, an imidazolyl group, a pyrrolyl group, or a carbazolyl group, particularly preferably a hydrogen atom, a fluorine atom, or a methyl group, most preferably a hydrogen atom.

$X^{53}$, $X^{54}$, and $X^{55}$ each independently represents a carbon atom or a nitrogen atom. When $X^{53}$, $X^{54}$, or $X^{55}$ can be substituted further, it may have a substituent. When $X^{53}$, $X^{54}$, or $X^{55}$ has a substituent, examples of the substituent include those exemplified in Substituent group A. The substituent is preferably an alkyl group, a perfluoroalkyl group, an aryl group, an aromatic heterocyclic group, a dialkylamino group, a diarylamino group, an alkyloxy group, a cyano group, or a halogen atom, more preferably an alkyl group, a perfluoroalkyl group, an aryl group, a dialkylamino group, a cyano group, or a fluorine atom, more preferably an alkyl group, a trifluoromethyl group, or a fluorine atom. If possible, the substituents may be coupled to form a fused ring structure.

In the formula (2a-1), the number of nitrogen atoms contained in the 5-membered ring skeleton formed of a carbon atom, a nitrogen atom, $X^{53}$, $X^{54}$, and $X^{55}$ is 1 or 2, preferably 2.

The 5-membered ring skeleton formed of a carbon atom, a nitrogen atom, $X^{53}$, $X^{54}$, and $X^{55}$ is, for example, a pyrrole ring, a pyrazole ring, or an imidazole ring, more preferably a pyrrole ring or a pyrazole ring, still more preferably a pyrazole ring. The 5-membered ring formed of a carbon atom, a nitrogen atom, $X^{53}$, $X^{54}$, and $X^{55}$ is advantageously a pyrrole ring, a pyrazole ring, or an imidazole ring (more preferably, a pyrrole ring or a pyrazole ring) because it improves stability of the metal complex.

L represents a single bond or a divalent linking group. Examples of the divalent lining group represented by L include alkylene groups (such as methylene, ethylene, and propylene), arylene groups (such as phenylene and naphthalenediyl), heteroarylene groups (such as pyridinediyl and thiophenediyl), imino groups (—NR—) (such as phenylimino), an oxy group (—O—), a thio group (—S—), phosphinidene groups (—PR—) (such as phenylphosphinidene), and silylene groups (—SiRR'—) (such as dimethylsilylene and diphenylsilylene), and combinations of these groups. These linking groups may have a substituent further. When these linking groups have a substituent, examples of the substituent include those exemplified in Substituent group A.

L preferably represents a single bond, an alkylene group, an arylene group, a heteroarylene group, an imino group, an oxy group, a thio group, or a silylene group, more preferably a single bond, an alkylene group, an arylene group, or an imino group, still more preferably a single bond, an alkylene group, or an arylene group, still more preferably a single bond, a methylene group, or a phenylene group, still more preferably a single bond or a di-substituted methylene group, still more preferably a single bond, a dimethylmethylene group, a diethylmethylene group, a diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group, or a fluoromethylmethylene group, particularly preferably a single bond, a dimethylmethylene group, a diphenylmethylene group, or a cyclohexanediyl group, most preferably a dimethylmethylene group or a diphenylmethylene group.

Specific examples of the divalent linking group are shown below, but the invention is not limited to them.

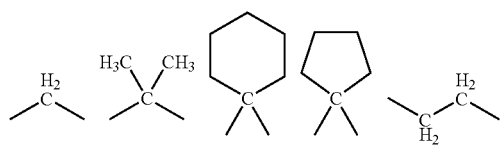

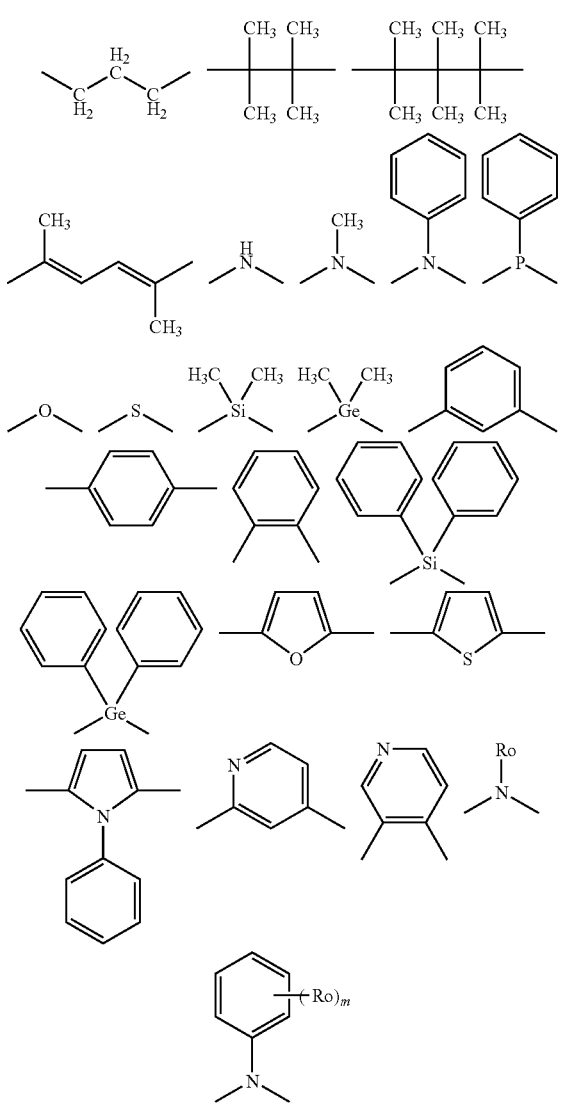

In the above formulae, Ro represents a substituent selected from Substituent group A, preferably an alkyl group, more preferably a $C_{1-6}$ alkyl group; and m stands for an integer from 1 to 5, more preferably from 2 to 5, still more preferably from 2 to 3.

The platinum complex represented by the formula (2a-1) is preferably represented by the formula (2a-2).

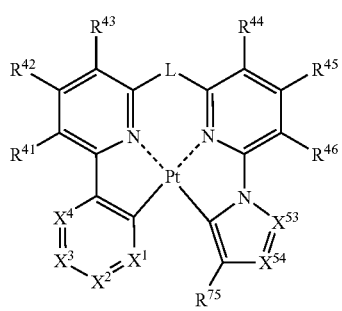

In the above formula, $X^1$, $X^2$, $X^3$, and $X^4$ each independently represents a carbon atom or a nitrogen atom and any one or more of $X^1$, $X^2$, $X^3$, and $X^4$ represent a nitrogen atom; $R^{41}$, $R^{42}$, $R^{43}$, $R^{44}$, $R^{45}$, and $R^{46}$ each independently represents a hydrogen atom or a substituent; $X^{53}$ and $X^{54}$ each independently represents a carbon atom or a nitrogen atom, and the number of nitrogen atoms contained in the 5-membered ring skeleton containing $X^{53}$ and $X^{54}$ is 1 or 2; $R^{75}$ represents a hydrogen atom or a substituent; and L represents a single bond or a divalent linking group.

$X^1$, $X^2$, $X^3$, $X^4$, $X^{53}$, $X^{54}$, $R^{41}$, $R^{42}$, $R^{43}$, $R^{44}$, $R^{45}$, $R^{46}$, and L in the formula (2a-2) have the same meanings as $X^1$, $X^2$, $X^3$, $X^4$, $X^{53}$, $X^{54}$, $R^{41}$, $R^{42}$, $R^{43}$, $R^{44}$, $R^{45}$, $R^{46}$, and L in the formula (2a-1) and preferred ranges of them are also the same.

$R^{75}$ represents a hydrogen atom or a substituent. Examples of the substituent include those exemplified in Substituent group A. $R^{75}$ represents preferably a hydrogen atom, an alkyl group, a perfluoroalkyl group, an aryl group, an aromatic heterocyclic group, a dialkylamino group, a diarylamino group, an alkyloxy group, a cyano group, or a halogen atom, more preferably a hydrogen atom, an alkyl group, a perfluoroalkyl group, an aryl group, a dialkylamino group, a cyano group, or a fluorine atom, still more preferably a hydrogen atom, an alkyl group, a trifluoromethyl group, a cyano group, or a fluorine atom, most preferably a cyano group, a fluorine atom, or a hydrogen atom. If possible, $R^{75}$ may be coupled to the substituent of $X^{54}$ or $X^{53}$ to form a fused ring structure.

The platinum complex represented by the formula (2a-2) is preferably represented by the formula (2a-3).

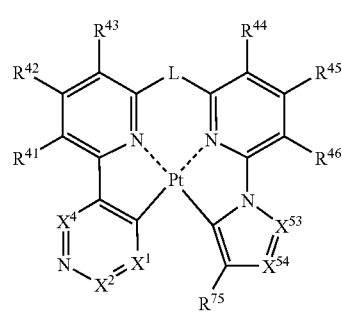

In the above formula, $X^1$, $X^2$, and $X^4$ each independently represents a carbon atom or a nitrogen atom. $R^{41}$, $R^{42}$, $R^{43}$, $R^{44}$, $R^{45}$, and $R^{46}$ each independently represents a hydrogen atom or a substituent, $X^{53}$ and $X^{54}$ each independently represents a carbon atom or a nitrogen atom. The number of nitrogen atoms contained in the 5-membered ring skeleton containing $X^{53}$ and $X^{54}$ is 1 or 2. $R^{75}$ represents a hydrogen atom or a substituent. L represents a single bond or a divalent linking group.)

$X^1$, $X^2$, $X^4$, $X^{53}$, $X^{54}$, $R^{41}$, $R^{42}$, $R^{43}$, $R^{44}$, $R^{45}$, $R^{46}$, $R^{75}$, and L in the formula (2a-3) have the same meanings as $X^1$, $X^2$, $X^4$, $X^{53}$, $X^{54}$, $R^{41}$, $R^{42}$, $R^{43}$, $R^{44}$, $R^{45}$, $R^{46}$, $R^{75}$, and L in the formula (2a-2) and the preferred range of them are also the same.

In the formula (2a-3), the number of nitrogen atoms contained in the 6-membered ring skeleton formed of $X^1$, $X^2$, a nitrogen atom, $X^4$, a carbon atom, and a carbon atom is preferably 1 or greater but not greater than 3, more preferably 1 or 2, still more preferably 1. Specific examples of the 6-membered ring include a pyridine ring, a pyrazine ring, a pyrimidine ring, a pyridazine ring, and a triazine ring. Of these, a pyridine ring, a pyrazine ring, and a pyrimidine ring are more preferred, with a pyridine ring, a pyrazine ring, and a pyrimidine ring being still more preferred and a pyridine ring being particularly preferred.

The platinum complex represented by the formula (2a-3) is preferably represented by the following formula (2a-4). The platinum complex represented by this formula (2a-4) is a novel compound.

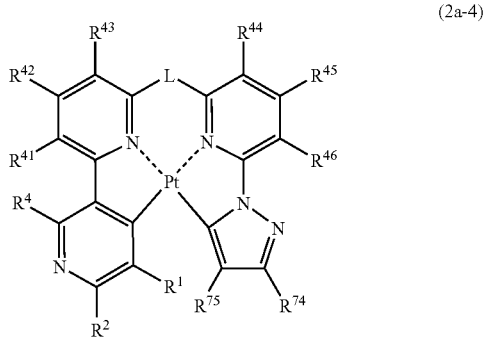

(2a-4)

In the above formula, $R^1$, $R^2$, $R^4$, $R^{41}$, $R^{42}$, $R^{43}$, $R^{44}$, $R^{45}$, $R^{46}$, $R^{74}$, and $R^{75}$ each independently represents a hydrogen atom or a substituent. L represents a single bond or a divalent linking group.

$R^{41}$, $R^{42}$, $R^{43}$, $R^{44}$, $R^{45}$, $R^{46}$, $R^{75}$, and L in the formula (2a-4) have the same meanings as $R^{41}$, $R^{42}$, $R^{43}$, $R^{44}$, $R^{45}$, $R^{46}$, $R^{75}$, and L in the formula (2a-3) and preferred ranges of them are also the same.

$R^1$, $R^2$, $R^4$, and $R^{74}$ each independently represents a hydrogen atom or a substituent. Examples of the substituent include those exemplified in Substituent group A. If possible, $R^4$ and $R^{41}$ or $R^1$ and $R^2$ may form a fused ring structure by coupling of their respective substituents or the ligands may form a cyclic structure together by coupling of the respective substituents of $R^1$ and $R^{75}$.

$R^1$ represents preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, an alkoxy group, an aryloxy group, an alkylthio group, a halogen atom, or a cyano group; still more preferably a hydrogen atom, an alkyl group, a perfluoroalkyl group, an aryl group, a halogen atom, or a cyano group; still more preferably a hydrogen atom, a methyl group, a trifluoromethyl group, or a cyano group; particularly preferably a hydrogen atom, a trifluoromethyl group, a fluorine atom, or a cyano group.

$R^2$ and $R^4$ each represents preferably a hydrogen atom, a halogen atom, a phenyl group substituted with a fluorine atom, an alkoxy group substituted with fluorine, a perfluoroalkyl group, a cyano group, a nitro group, or an aryloxy group; more preferably a hydrogen atom, a fluorine atom, a phenyl group substituted with a fluorine atom, a trifluoromethoxy group, a trifluoromethyl group, a cyano group, or a phenoxy group; still more preferably a hydrogen atom, a fluorine atom, a perfluorophenyl group, a trifluoromethyl group, a cyano group, or a phenoxy group substituted with an electron withdrawing substituent; particularly preferably a hydrogen atom or a fluorine atom; most preferably a fluorine atom.

$R^{74}$ represents preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, an alkoxy group, an aryloxy group, an alkylthio group, a halogen atom, or a cyano group; still more preferably a hydrogen atom, an alkyl group, a perfluoroalkyl group, an aryl group, a halogen atom, or a cyano group; still more preferably a hydrogen atom, a methyl group, a trifluoromethyl group, or a cyano group; particularly preferably a hydrogen atom, a trifluoromethyl group, a fluorine atom, or a cyano group; most preferably a trifluoromethyl group or a cyano group.

The platinum complex represented by the formula (2a-4) can be used as various materials to be used for organic EL devices. In addition, it can be used as a light emitting material suited for use in the fields of display devices, displays, backlights, electrophotography, illumination light sources, recording light sources, exposure light sources, reading light sources, indicators, signboards, and interior designs, for medical uses, fluorescent brighteners, photographic materials, UV absorbing materials, laser dyes, recording media materials, inkjet pigments, color filter dyes, color conversion filters, analyses, solar cell materials, organic thin-film transistor materials, and the like.

The metal complex having a specific structure may be a low-molecular-weight compound, a high-molecular-weight compound having a residue coupled to the polymer main chain thereof (having preferably a mass average molecular weight of from 1000 to 5000000, more preferably from 5000 to 2000000, still more preferably from 10000 to 1000000), or a high-molecular-weight compound having, as a main chain thereof, the structure of the metal complex having a specific structure (having preferably a mass average molecular weight of from 1000 to 5000000, more preferably from 5000 to 2000000, still more preferably from 10000 to 1000000). It is however preferably a low-molecular-weight compound.

The high-molecular-weight compound may be a homopolymer or a copolymer with another polymer. When it is a copolymer, it may be a random copolymer or a block copolymer. When it is a copolymer, it may have, in the polymer thereof, a compound having a light emitting function and/or a compound having a charge transporting function.

The following are preferred specific examples of the metal complex represented by the formula (2a-1), but the invention is not limited to them.

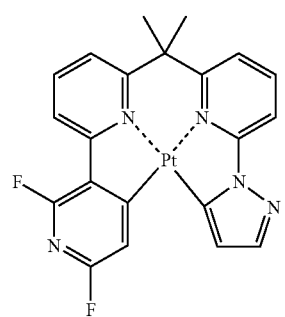

1

2
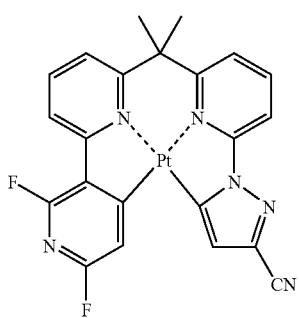
3
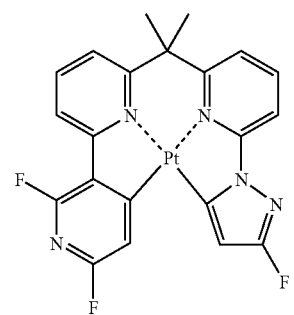
4
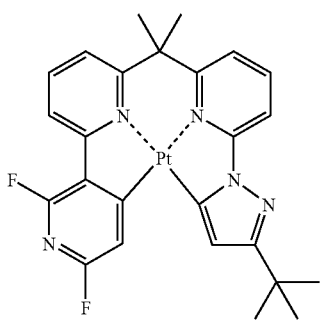
5
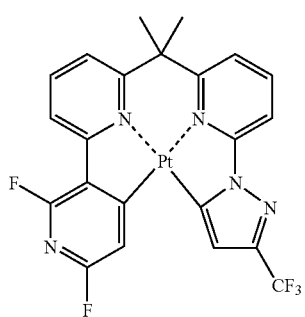
6
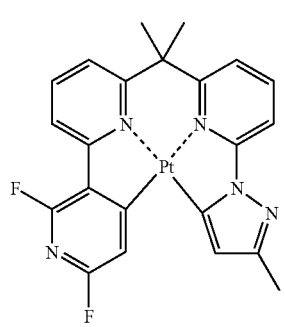
7
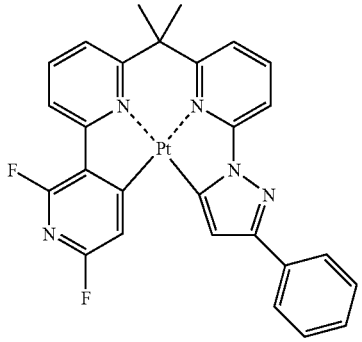
8
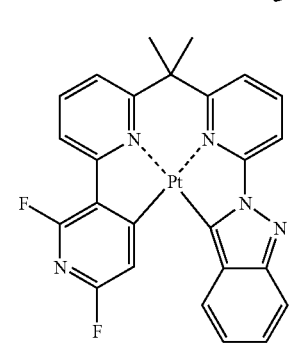
9
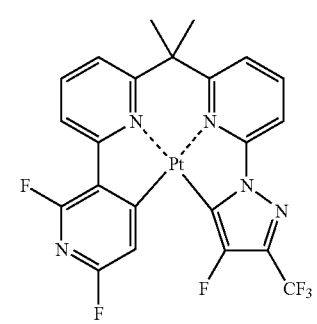
10
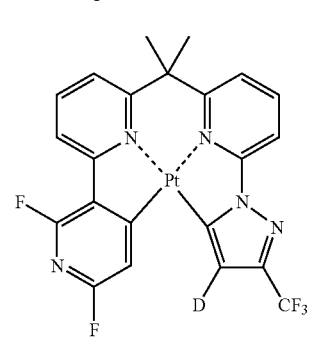
11

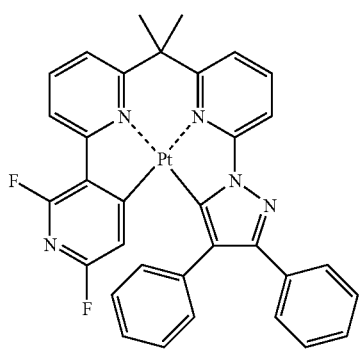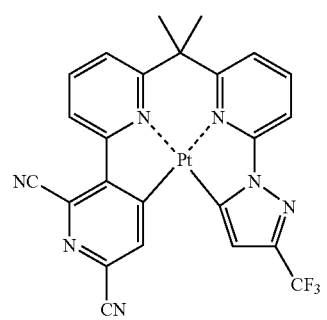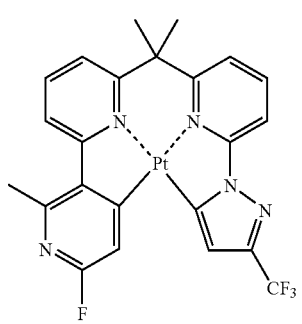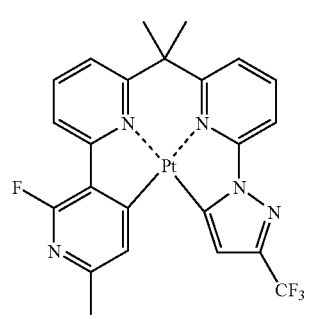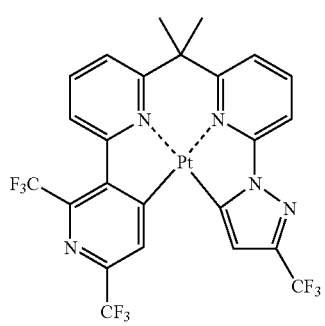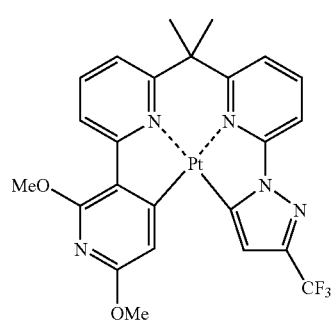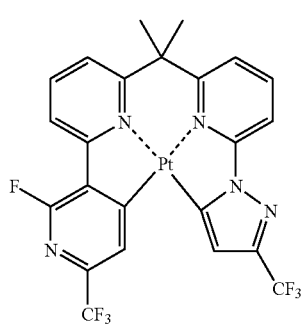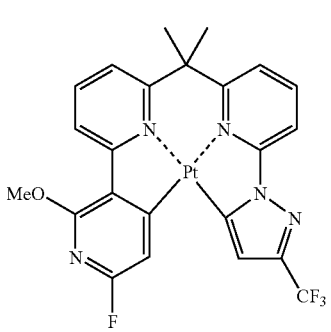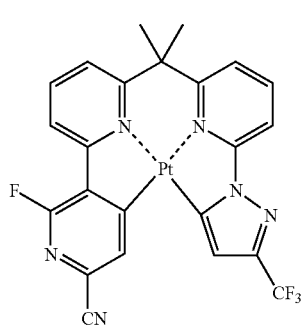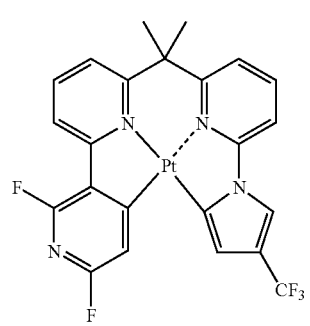

22
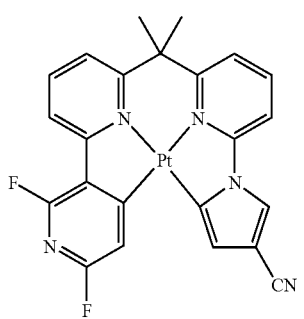
23
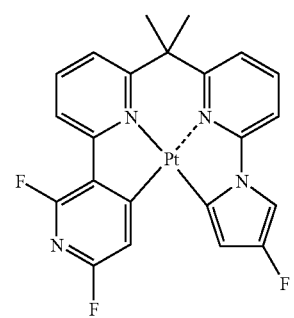
24
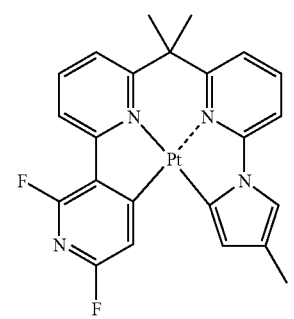
25
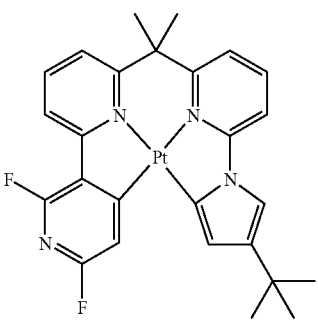
26
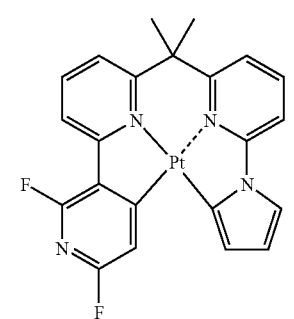
27
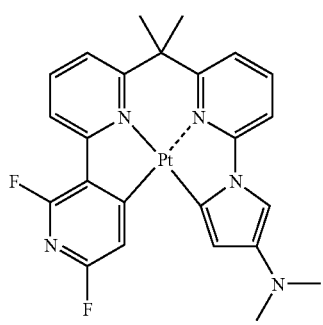
28
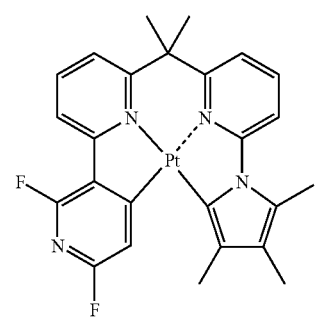
29
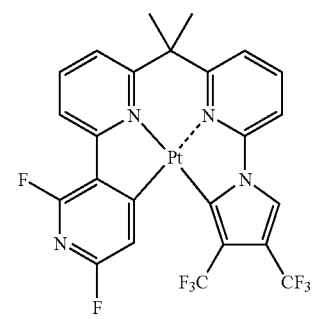
30
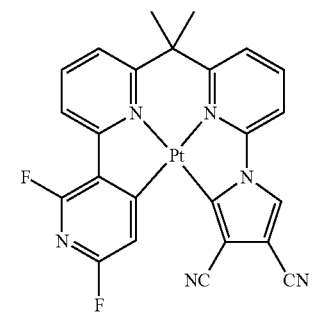
31
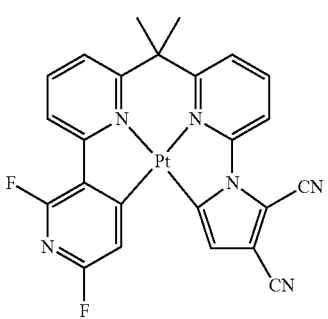

-continued
32
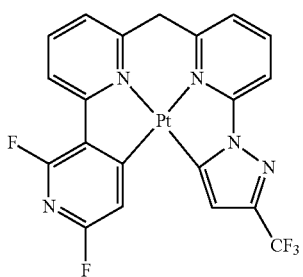
33
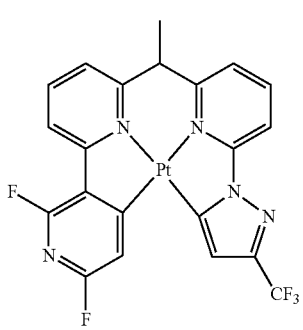
34
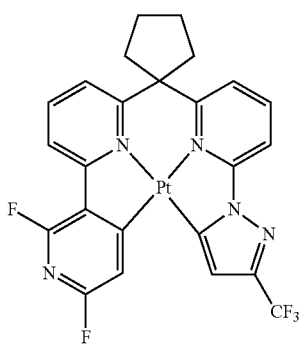
35
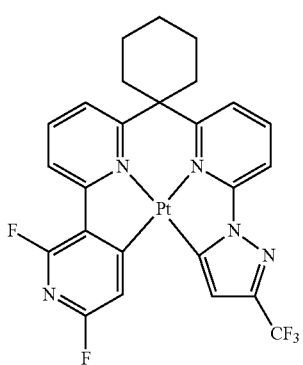
-continued
36
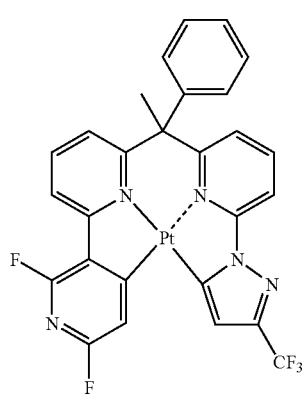
37
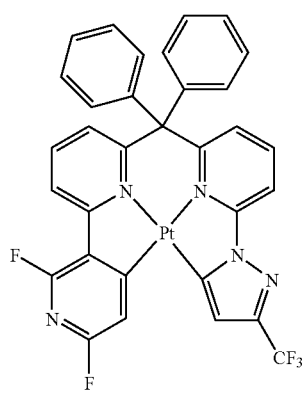
38
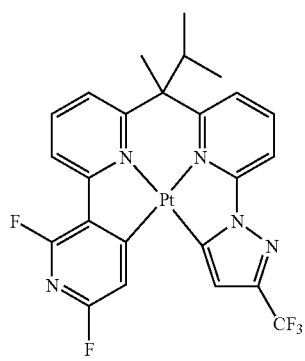
39
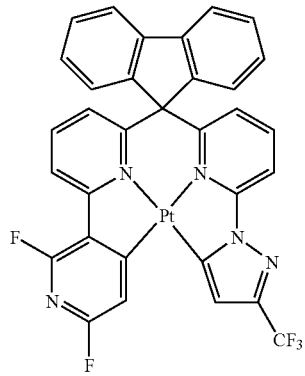

40
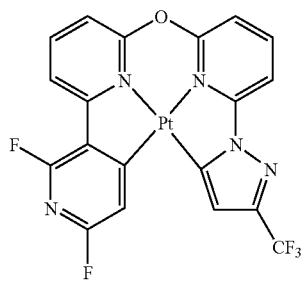
41
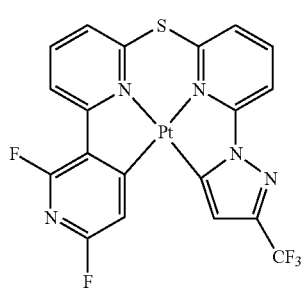
42
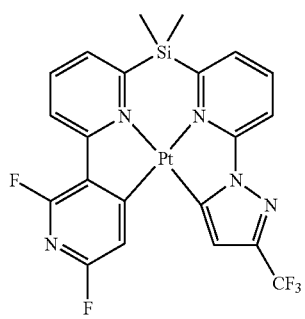
43
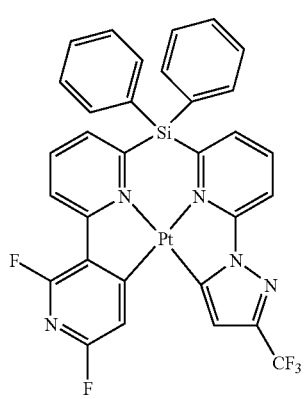
44
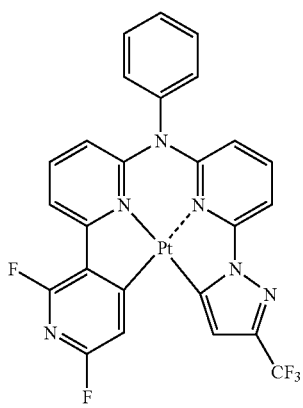
45
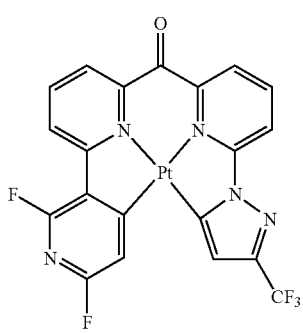
46
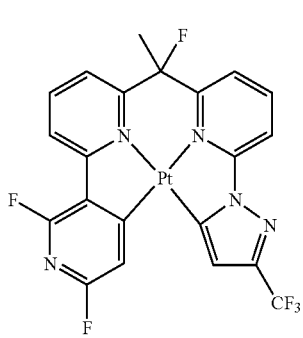
47
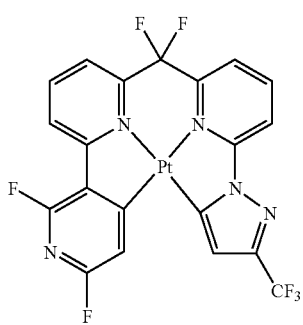

48
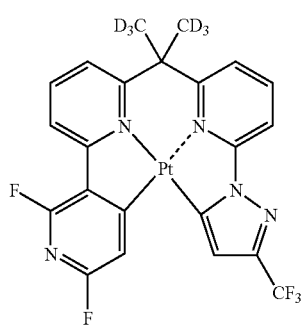
49
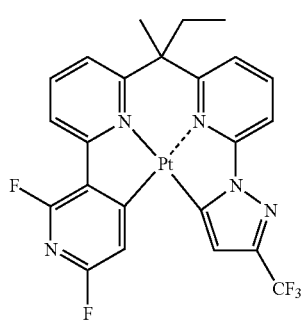
50
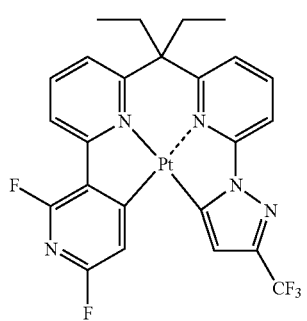
51
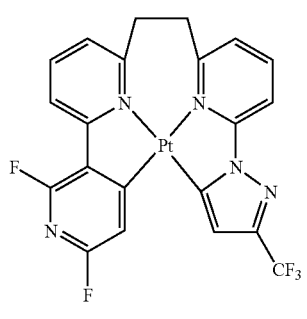
52
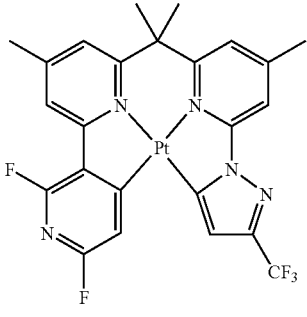
53
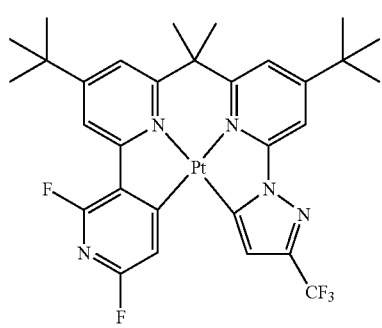
54
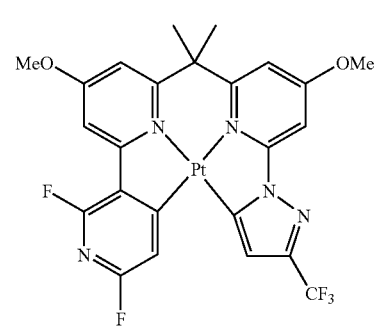
55
56
57
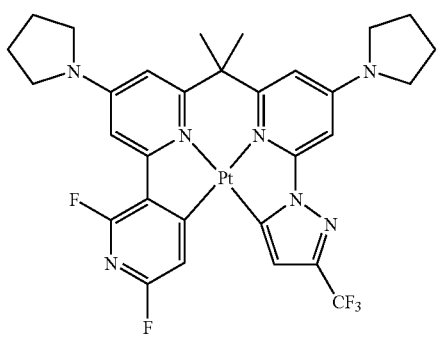

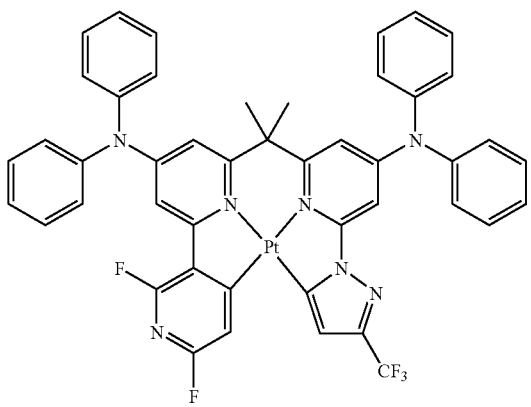
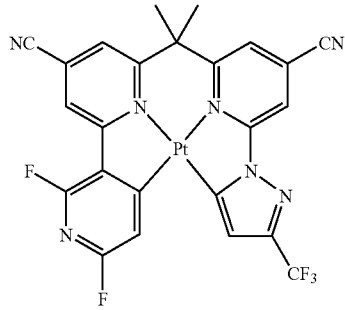
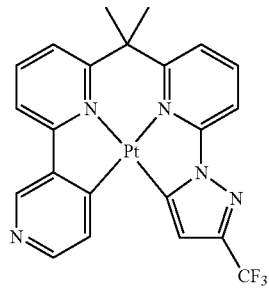
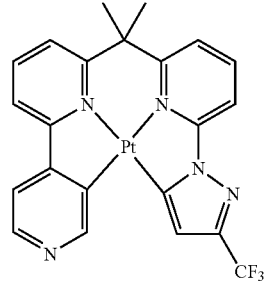
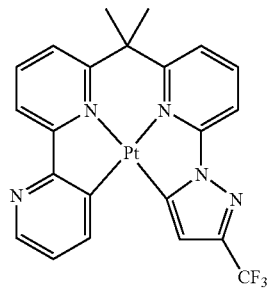
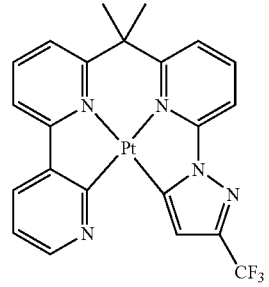

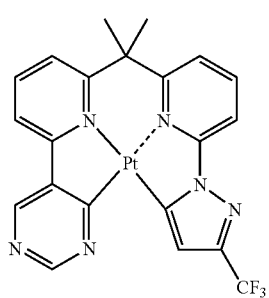
67
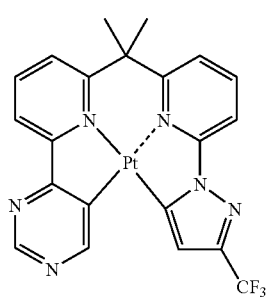
68
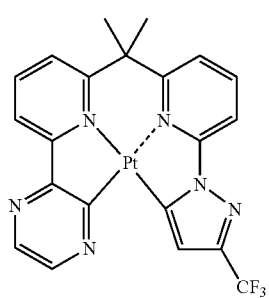
69
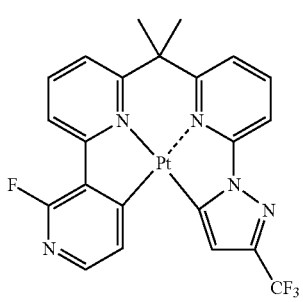
70
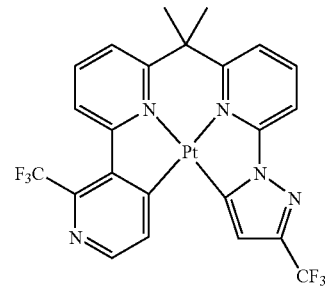
71
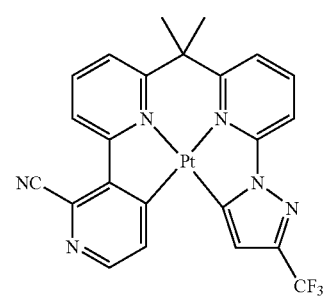
72
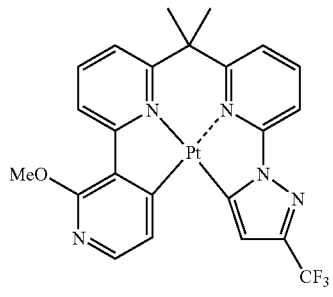
73
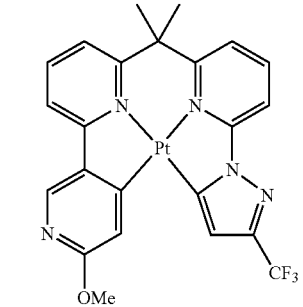
74
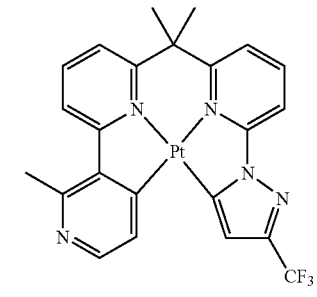
75
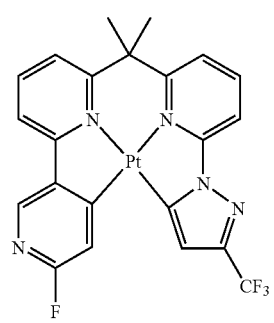
76

77
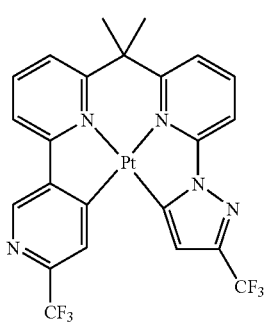
78
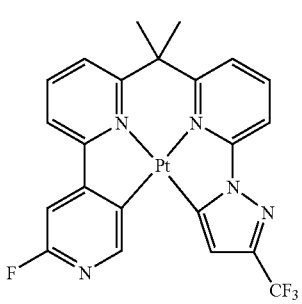
79
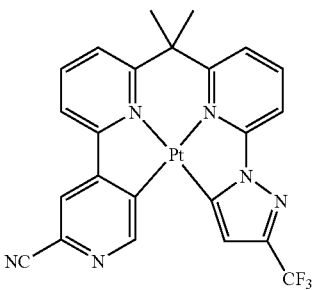
80
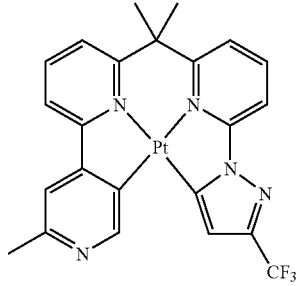
81
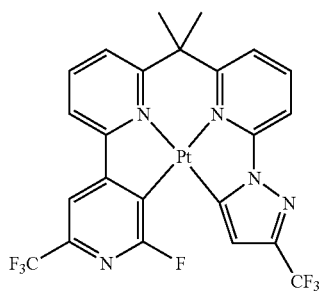
82
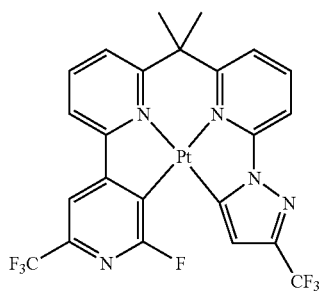
83
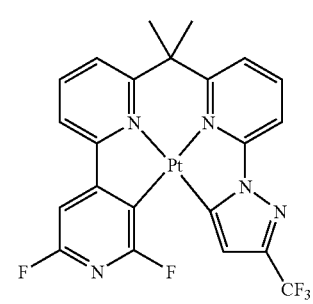
84
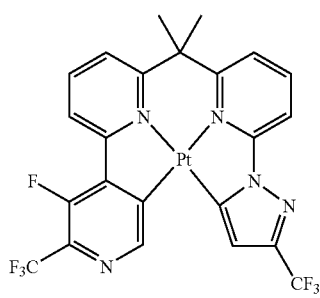
85
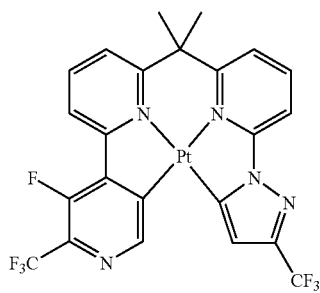
86
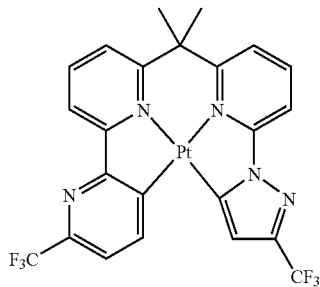

87
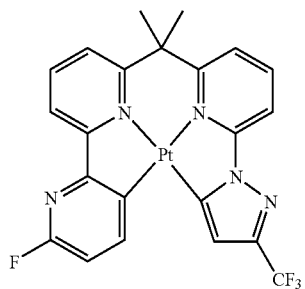
88
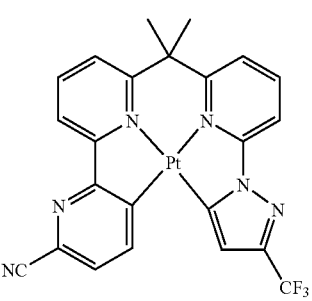
89
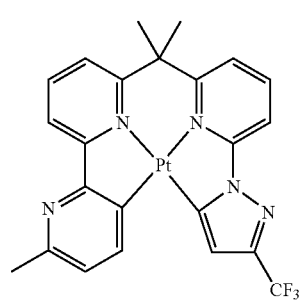
90
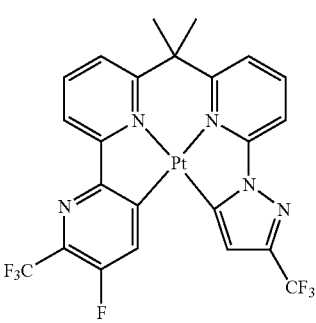
91
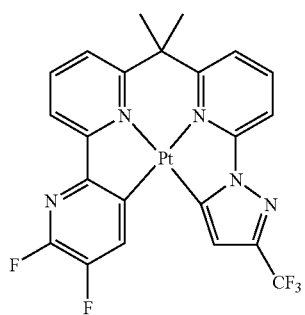
92
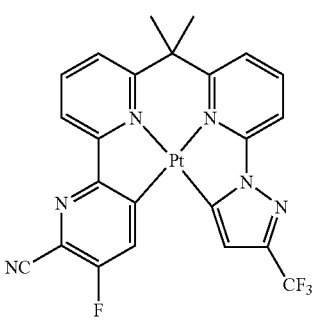
93
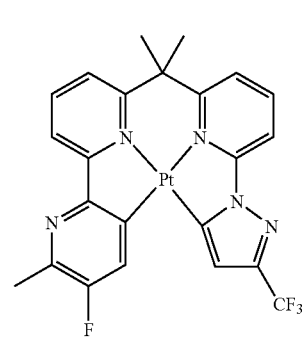
94
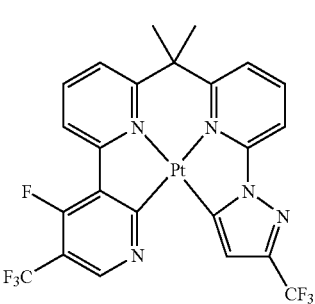
95
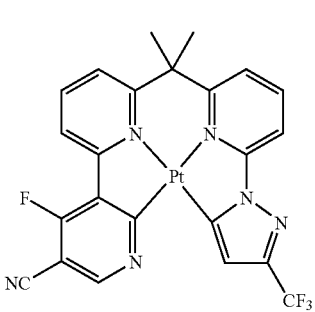
96
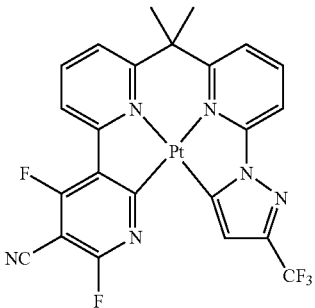

97
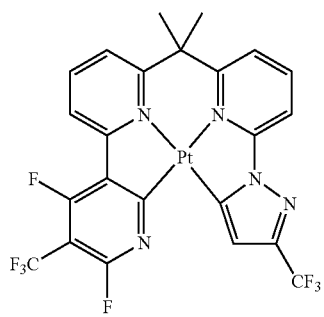
98
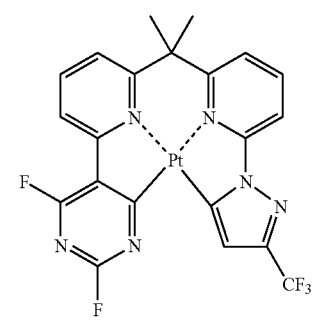
99
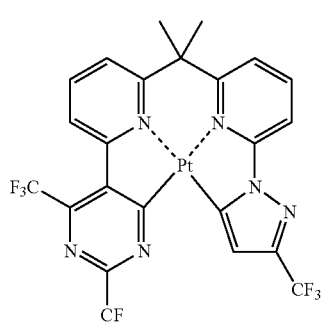
100
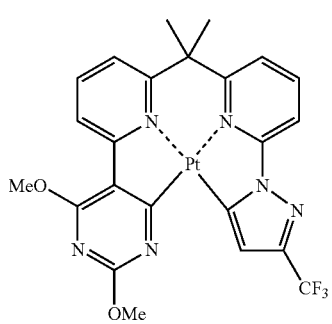
101
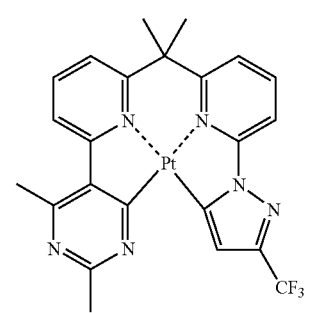
102
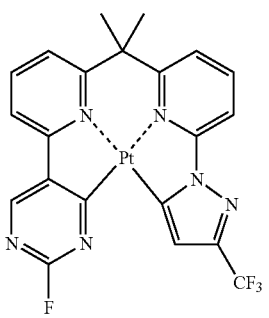
103
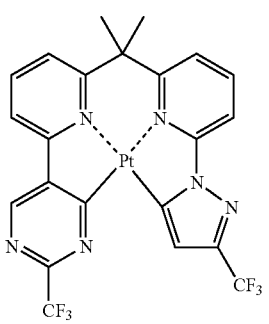
104
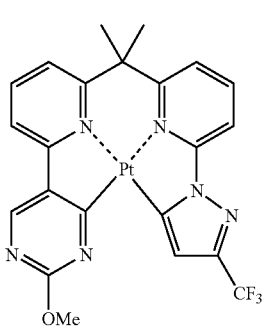
105
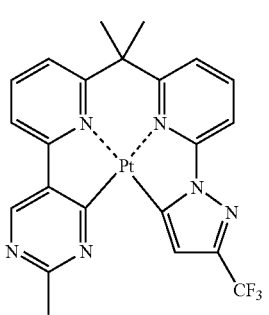
106
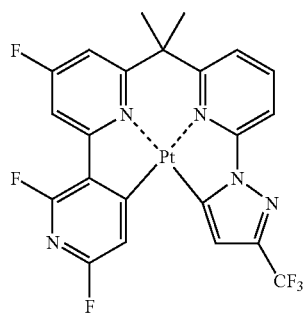

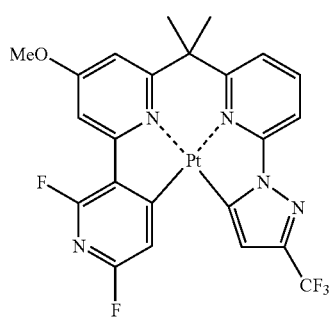
107
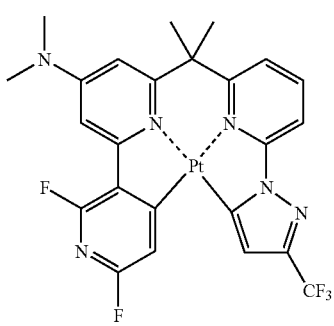
108
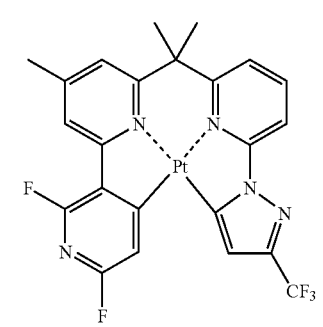
109
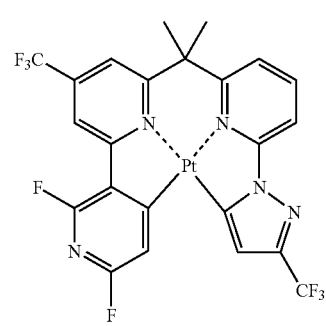
110
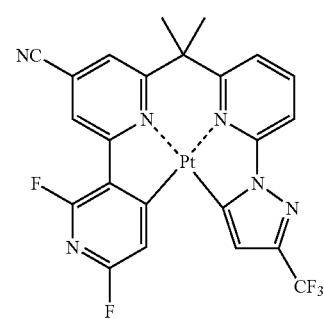
111
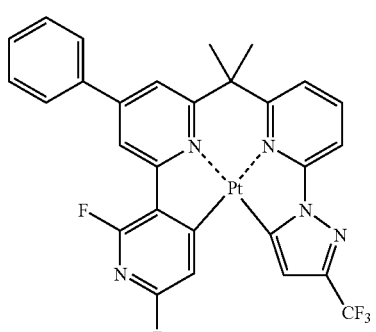
112
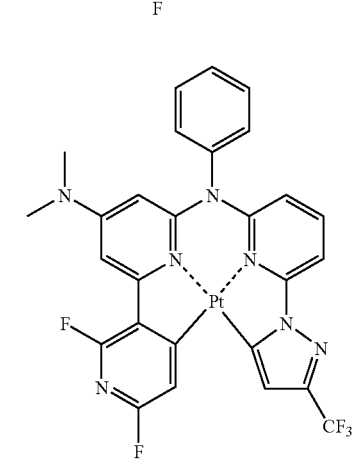
113
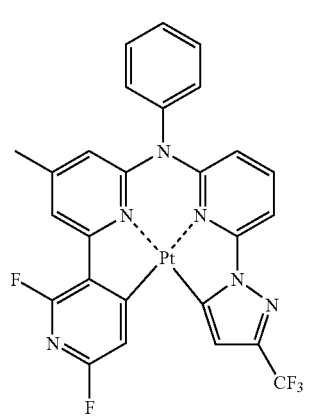
114
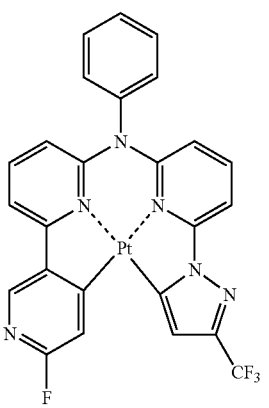
115

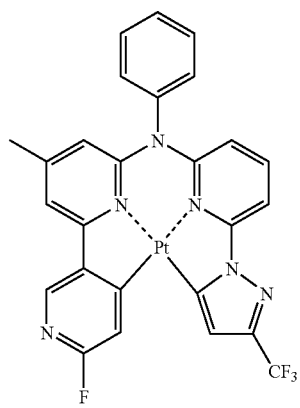

116

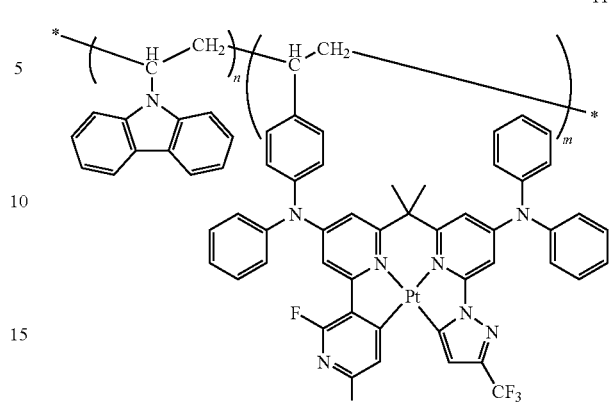

119 n, m: natural number

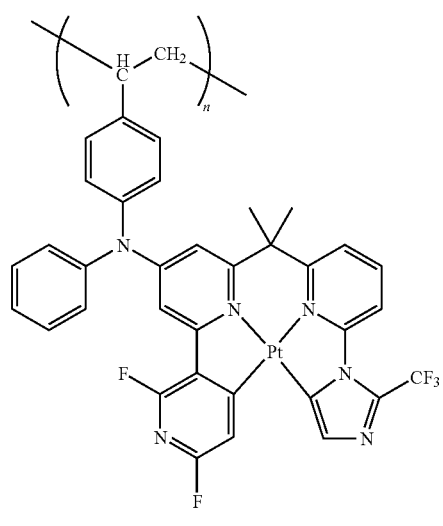

117 n: natural number

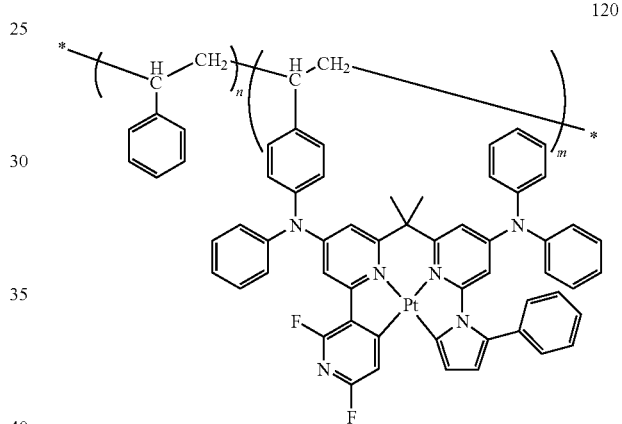

120 n, m: natural number

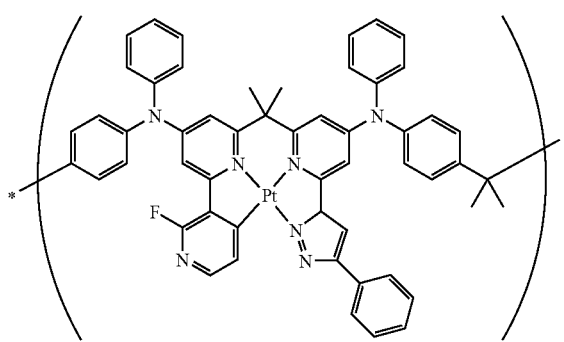

118 n: natural number

A preparation process of the metal complex represented by the formula (2a-1) will next be described.

The metal complex represented by the formula (2a-1) can be obtained by reacting, in the presence of a solvent, a compound represented by the formula (C-0) (which may hereinafter be called "ligand") with a platinum salt.

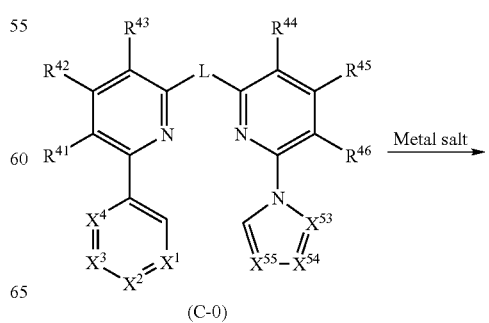

(C-0)

-continued

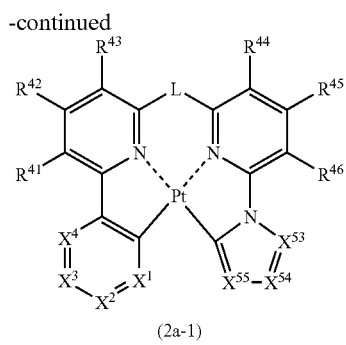

(2a-1)

$X^1, X^2, X^3, X^4, X^{53}, X^{54}, X^{55}, R^{41}, R^{42}, R^{43}, R^{44}, R^{45}, R^{46}$ and L in the formula (C-0) have the same meanings as $X^1, X^2, X^3, X^4, X^{53}, X^{54}, X^{55}, R^{41}, R^{42}, R^{43}, R^{44}, R^{45}, R^{46}$, and L in the formula (2a-1) and preferred ranges of them are also the same.

Examples of the platinum salt to be used in the complex formation reaction with the ligand in the preparation of the platinum complex and containing divalent platinum include platinum chloride, platinum bromide, platinum iodide, platinum acetylacetonate, bis(benzonitrile)dichloroplatinum, bis(acetonitrile)dichloroplatinum, dichloro(1,5-cyclooctadiene)platinum, dibromobis(triphenylphosphine)platinum, dichloro(1,10-phenanthroline)platinum, dichlorobis(triphenylphosphine)platinum, ammonium tetrachloroplatinate, diamminedibromoplatinum, diamminedichloroplatinum, diamminediiodoplatinum, potassium tetrabromoplatinate, potassium tetrachloroplatinate, sodium tetrachloroplatinate, dimethyl-bis(dimethyl sulfoxide)platinum, dimethyl-bis(dimethyl sulfide)platinum, and dimethyl(bicyclo[2.2.1]hepta-2,5-diene)platinum.

More preferred examples of the platinum salt include platinum halides such as platinum chloride, platinum bromide, and platinum iodide; nitrile complexes such as bis(benzonitrile)dichloroplatinum and bis(acetonitrile)dichloroplatinum; and olefin complexes such as dichloro(1,5-cyclooctadiene)platinum. Of these, platinum halides such as platinum chloride and platinum bromide and nitrile complexes such as bis(benzonitrile)dichloroplatinum and bis(acetonitrile)dichloroplatinum are still more preferred.

The platinum salt used in the preparation of the platinum complex may contain water of crystallization, a solvent of crystallization, or a coordinating solvent. Although the valence of the metal is not particularly limited, the metal is preferably divalent or zero-valent, more preferably divalent.

The amount of the platinum salt to be used at the time of a complex forming reaction between the platinum salt and the ligand in the preparation of the platinum complex is typically from 0.1 to 10 mols, preferably from 0.5 to 5 mols, more preferably from 1 to 3 mols per mol of the ligand, when the platinum salt contains one metal atom constituting the complex. The amount of the platinum salt may be 1/n times when the platinum salt contains n pieces of metal atoms constituting the complex.

In the preparation of the platinum complex, examples of the solvent to be used at the time of a complex forming reaction between the platinum salt and the ligand include amides such as N,N-dimethylformamide, formamide and, N,N-dimethylacetamide; nitriles such as acetonitrile, propionitrile, butyronitrile, and benzonitrile; halogenated hydrocarbons such as dichloromethane, 1,2-dichloroethane, chloroform, carbon tetrachloride, chlorobenzene, and o-dichlorobenzene; aliphatic hydrocarbons such as pentane, hexane, octane, and decane; aromatic hydrocarbons such as benzene, toluene, xylene, and mesitylene; ethers such as diethyl ether, diisopropyl ether, butyl ether, tert-butyl methyl ether, 1,2-dimethoxyethane, tetrahydrofuran, and 1,4-dioxane; ketones such as acetone, methyl ethyl ketone, and methyl isobutyl ketone; alcohols such as methanol, ethanol, 1-propanol, 2-propanol, tert-butyl alcohol, 2-methoxyethanol, 2-ethoxyethanol, ethylene glycol, and glycerin; and water.

More preferred examples of the solvent include nitriles such as acetonitrile, propionitrile, butyronitrile, and benzonitrile; aromatic hydrocarbons such as benzene, toluene, xylene, and mesitylene; and alcohols such as methanol, ethanol, 1-propanol, 2-propanol, tert-butyl alcohol, 2-methoxyethanol, 2-ethoxyethanol, ethylene glycol, and glycerin. Of these, nitriles such as acetonitrile, propionitrile, butyronitrile, and benzonitrile; and aromatic hydrocarbons such as benzene, toluene, xylene, and mesitylene are still more preferred.

These solvents may be used either singly or as a mixture of two or more thereof.

In the preparation of the platinum complex, the amount of the solvent to be used at the time of a complex forming reaction between the platinum salt and the ligand is not particularly limited insofar as it is sufficient for thoroughly achieving the reaction. It is typically from 1 to 200 times by volume, preferably from 5 to 100 times by volume relative to the ligand to be used.

In the preparation of the platinum complex, when an acidic substance such as a hydrogen halide is generated at the time of a complex forming reaction between the platinum salt and the ligand, the reaction may be carried out in the presence of a basic substance. Examples of the basic substance include tertiary amines such as triethylamine, diisopropylethylamine, pyridine, and 1,8-dimethylaminonaphthalene; metal alkoxides such as sodium methoxide and sodium ethoxide; and inorganic bases such as sodium hydroxide, potassium hydroxide, potassium carbonate, and sodium hydrogen carbonate.

In the preparation of the platinum complex, the complex forming reaction between the platinum salt and the ligand is carried out preferably in an inert gas atmosphere. Examples of the inert gas include nitrogen and argon.

In the preparation of the platinum complex, the reaction temperature, reaction time, and reaction pressure at the time of a complex forming reaction between the platinum salt and the ligand vary depending upon the raw materials, solvent, and the like. The reaction temperature is typically in a range of from 20° C. to 300° C., preferably from 50° C. to 250° C., more preferably from 80° C. to 220° C. The reaction time is typically from 30 minutes to 24 hours, preferably from 1 hour to 12 hours, more preferably from 2 hours to 10 hours. Although the reaction pressure is typically atmospheric pressure, the reaction may be performed under pressure or under reduced pressure, if desired.

In the preparation of the platinum complex, a heating unit at the time of a complex forming reaction between the platinum salt and the ligand is not particularly limited. Specifically, heating by using an oil bath or a mantle heater, or heating by exposure to microwaves can be used.

The platinum complex thus obtained can be isolated and purified, if desired. Examples of a method for isolation and purification include column chromatography, recrystallization, reprecipitation, and sublimation. These methods may be employed either singly or in combination.

The platinum complex represented by the formula (2a-1) can also be synthesized by using the preparation process described below. It is to be noted that the preparation process is not limited to the following one.

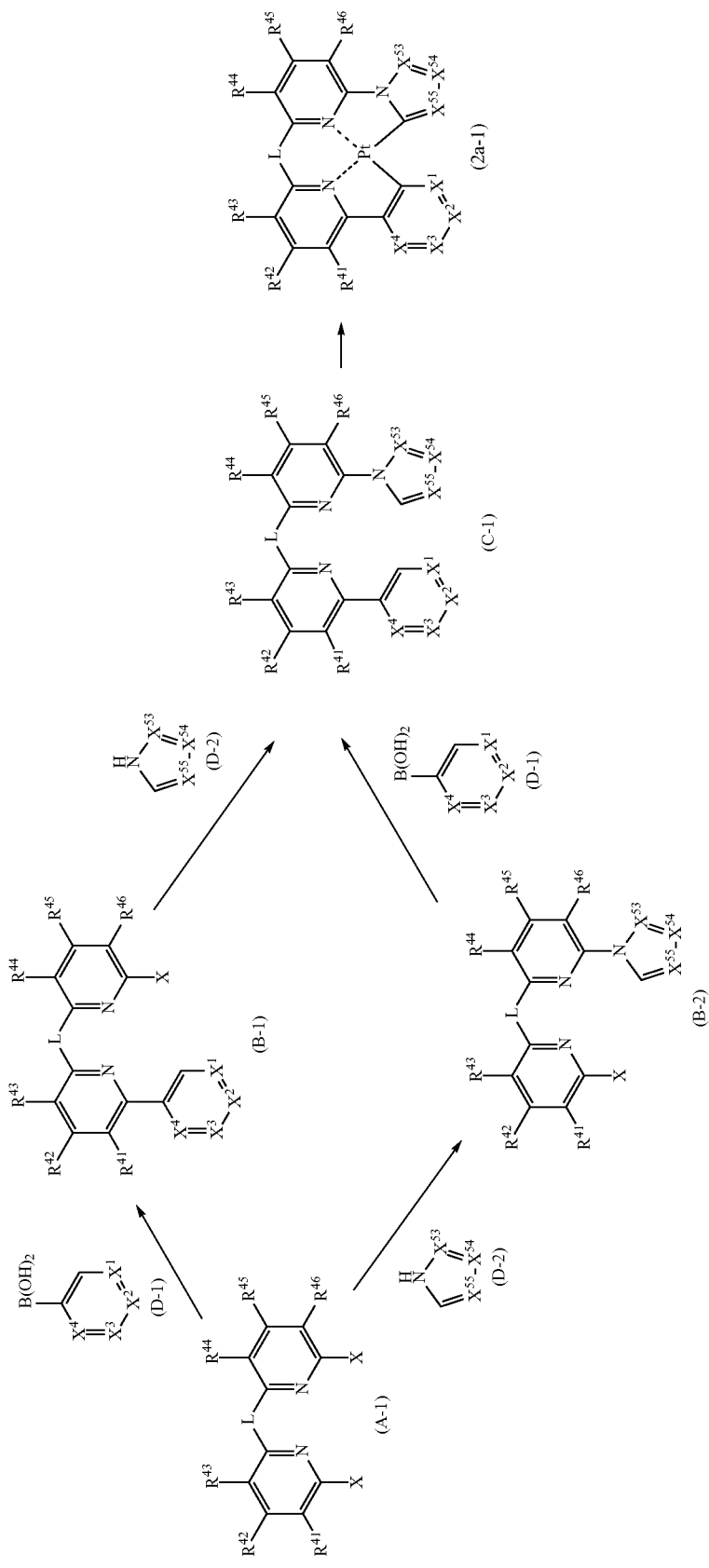

In the above formula, $X^1$, $X^2$, $X^3$, $X^4$, $X^{53}$, $X^{54}$, $X^{55}$, $R^{41}$, $R^{42}$, $R^{43}$, $R^{44}$, $R^{45}$, $R^{46}$, and L have the same meanings as those described in the formula (2a-3). X represents a halogen atom, preferably a chlorine atom, an iodine atom, or a bromine atom, more preferably a bromine atom.

As a step of obtaining (B-1) from (A-1) and a step of obtaining (C-1) from (B-2), using a process described in *Synth. Commun.*, 11, 513 (1981), or the like enables to yield the intended compounds.

As a step of obtaining (C-1) from (B-1) and a step of (B-2) from (A-1), using a process described in *Angew. Chem. Int. Ed.*, 42, 2051-2053 (2003) or the like enables to yield the intended compounds.

As a step of obtaining the platinum complex represented by the formula (2a-1) from (C-1), using the following process, that is, dissolving Compound (C-1) and from 1 to 1.5 equivalents of platinum(I) chloride in benzonitrile, heating the resulting solution at from 130° C. to the heat reflux temperature (boiling temperature of benzonitrile: 191° C.) and stirring it for from 30 minutes to 4 hours enables to synthesize the intended compound. The platinum complex represented by the formula (2a-1) can be purified by recrystallization from chloroform, dichloromethane, toluene, xylene, acetonitrile, butyronitrile, benzonitrile, ethyl acetate, or the like, silica gel column chromatography, purification by sublimation, or the like.

In the preparation process described above, when the defined substituent varies under conditions of a certain synthesis process or is inadequate for carrying out the process, the intended compound can be prepared easily by measures such as protection and deprotection of a functional group (for example, *Protective Groups in Organic Synthesis*, written by T. W. Greene, John Wiley & Sons Inc. (1981), etc.). Also, the order of the reaction steps such as introduction of a substituent can be properly changed as desired.

The light emitting material in the light emitting layer is usually contained in an amount of from 0.1 mass % to 50 mass % based on the total mass of all the compounds constituting the light emitting layer. It is preferably from 1 mass % to 50 mass %, more preferably from 2 mass % to 40 mass % from the standpoint of durability and external quantum efficiency.

Although no particular limitation is imposed on the thickness of the light emitting layer, the thickness from 2 nm to 500 nm is typically preferred. From the standpoint of external quantum efficiency, the thickness is more preferably from 3 nm to 200 nm, more preferably from 5 nm to 100 nm.

<Host Material>

As the host material usable in the invention, the following materials as well as the compounds of the invention can be used.

Examples of the host material include electron transport materials and hole transport materials. It is preferably a charge transport material. One or more host materials are usable. The constitution of the host material is, for example, a mixture of an electron transporting host material and a hole transporting host material.

Examples include conductive high-molecular oligomers such as pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin compounds, polysilane compounds, poly (N-vinylcarbazole), aniline copolymers, thiophene oligomers, and polythiophene, organic silanes, carbon films, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic anhydrides such as naphthalene perylene, phthalocyanine, and various metal complexes such as metal complexes of 8-quinolinol derivatives and metal complexes having metal phthalocyanine, benzoxazole, or benzothiazole as a ligand thereof, and derivatives thereof (which may have a substituent or a fused ring).

In the light emitting layer in the invention, the host material (including the compound represented by the formula (I)) has preferably a lowest excited triplet energy ($T_1$ energy) higher than the $T_1$ energy of the phosphorescent material from the standpoint of color purity, luminous efficiency, and running durability.

Although the content of the host compound in the invention is not particularly limited, it is preferably 15 mass % or greater but not greater than 95 mass % based on the total mass of all the compounds constituting the light emitting layer from the standpoint of luminous efficiency and drive voltage.

The organic electroluminescent device contains, in the light emitting layer thereof, a compound represented by the following formula (a) further.

It is usually known that in charge (electron/hole) injection at the interface of an organic thin film of a stack type organic electron device, as a difference in ionization potential (Ip) between two materials adjacent to each other or a difference in electron affinity (Ea) between them is smaller, the injection barrier of charges becomes smaller, leading to reduction in drive voltage of the organic electroluminescent device. As well as Ip or Ea of a material, an energy level derived from the intermolecular reaction of the material has an important role. As regards the transfer of charges in the organic layer, the charge mobility can be enhanced and drive voltage of the device can be reduced by properly controlling the interaction between molecules of the material. Proper use of the compound represented by the formula (a) in combination with the light emitting material enables to control the interaction between the molecules of the material, which may result in reduction in drive voltage.

A change in the interaction state (for example, association state) between the molecules of the material at the time of driving the device brings about a change in the properties of the device, which may become one cause of a reduction in luminance (i.e., life of the device) of the device. When the compound represented by the formula (a) is used, however, a stable interaction state can be formed in advance and the above problem can be avoided. The compound represented by the formula (a), which is used in the organic electroluminescent device of the invention, is excellent in chemical stability, undergoes a small change in quality of the material such as decomposition during operation of the device so that deterioration in efficiency or life of the organic electroluminescent device due to the decomposition product of the material can be prevented.

The compound represented by the formula (a) and used for the organic electroluminescent device of the invention will next be described in detail.

(a)

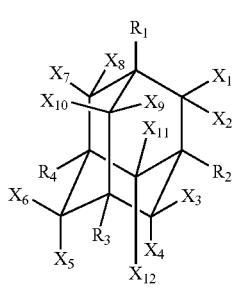

In the formula (a), $R_1$ to $R_4$ each independently represents a hydrogen atom, an alkyl group, an aryl group, a heteroaryl group, or a silyl group and at least one of $R_1$ to $R_4$ represents an aryl group; $X_1$ to $X_{12}$ each independently represents a hydrogen atom, an alkyl group, an aryl group, a heteroaryl group, or a silyl group.

Examples of the alkyl group represented by $R_1$ to $R_4$ and $X_1$ to $X_{12}$ include methyl, ethyl, n-propyl, isopropyl, n-butyl, sec-butyl (i.e., 2-butyl), isobutyl, tert-butyl, n-pentyl, isopentyl, n-hexyl, cyclopropyl, cyclobutyl, cyclopentyl, and cyclohexyl.

Examples of the aryl group represented by $R_1$ to $R_4$ and $X_1$ to $X_{12}$ include phenyl, o-tolyl (i.e., 1-(2-methylphenyl)), m-tolyl, p-tolyl, 1-(2,3-dimethylphenyl), 1-(3,4-dimethylphenyl), 2-(1,3-dimethylphenyl), 1-(3,5-dimethylphenyl), 1-(2,5-dimethylphenyl), p-cumenyl, mesityl, 1-naphtyl, 2-naphtyl, 1-anthranyl, 2-anthranyl, 9-anthranyl, biphenylyls such as 4-biphenylyl (i.e., 1-(4-phenyl)phenyl), 3-biphenylyl and 2-biphenylyl, and terphenylyls such as 4-p-terphenylyl (i.e., 1-4-(4-biphenylyl)phenyl) and 4-m-terphenylyl (i.e., 1-4-(3-biphenylyl)phenyl).

The heteroaryl group represented by $R_1$ to $R_4$ and $X_1$ to $X_{12}$ contains a heteroatom such as a nitrogen atom, an oxygen atom, a sulfur atom or the like. Specific examples of the heteroaryl group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzothiazolyl, carbazolyl, and azepinyl.

Examples of the silyl group represented by $R_1$ to $R_4$ and $X_1$ to $X_{12}$ include trimethylsilyl, triethylsilyl, triisopropylsilyl, triphenylsilyl, methyldiphenylsilyl, dimethylphenylsilyl, tert-butyldimethylsilyl, and tert-butyldiphenylsilyl.

$R_1$ to $R_4$ and $X_1$ to $X_{12}$ described above may be substituted further by another substituent. Examples of an aryl-substituted alkyl group include benzyl, 9-fluorenyl, 1-(2-phenylethyl), and 1-(4-phenyl)cyclohexyl, while those of a heteroaryl-substituted aryl group include 1-(4-N-carbazolyl)phenyl, 1-(3,5-di(N-carbazolyl))phenyl, and 1-(4-(2-pyridyl)phenyl).

$R_1$ to $R_4$ represents preferably a hydrogen atom, an alkyl group, an aryl group, a heteroaryl group, or a silyl group, more preferably a hydrogen atom, an alkyl group, an aryl group, or a heteroaryl group, particularly preferably a hydrogen atom, an alkyl group, or an aryl group.

$X_1$ to $X_{12}$ represents preferably a hydrogen atom, an alkyl group, an aryl group, a heteroaryl group, or a silyl group, more preferably a hydrogen atom, an alkyl group, or an aryl group, particularly preferably a hydrogen atom.

The alkyl group represented by any of $R_1$ to $R_4$ and $X_1$ to $X_{12}$ is preferably methyl, ethyl, n-propyl, isopropyl, n-butyl, isobutyl, tert-butyl, n-pentyl, n-hexyl, cyclopentyl, or cyclohexyl, more preferably methyl, ethyl, tert-butyl, n-hexyl, or cyclohexyl, particularly preferably methyl or ethyl.

The aryl group represented by any of $R_1$ to $R_4$ and $X_1$ to $X_{12}$ is preferably phenyl, o-tolyl, 1-(3,4-dimethylphenyl), 1-(3,5-dimethylphenyl), 1-naphthyl, 2-naphthyl, 9-anthranyl, a biphenylyl, or a terphenylyl, more preferably, phenyl, a biphenylyl, or a terphenylyl, still more preferably phenyl.

The hydrogen atom represented by any of $R_1$ to $R_4$ and $X_1$ to $X_{12}$ may be a deuterium atom and it is preferably a deuterium atom.

The hydrogen atoms contained in the compound represented by formula (a) may be replaced partly or entirely with deuterium atoms.

When one to three of $R_1$ to $R_4$ represent(s) a phenyl group, the residue(s) of $R_1$ to $R_4$ composed only of a single bond is preferably a hydrogen atom, an alkyl group, or a silyl group, with a hydrogen atom or an alkyl group being particularly preferred.

$R_1$ to $R_4$ and $X_1$ to $X_{12}$ may be coupled to each other to form a cyclic structure. For example, $X_2$, $X_3$ and $X_9$ may be coupled to each other to form a diamantane structure or $X_4$, $X_5$, and $X_{12}$ may be coupled to each other to form a triamantane structure. The diamantine structure or triamantane structure may be substituted further with a substituent.

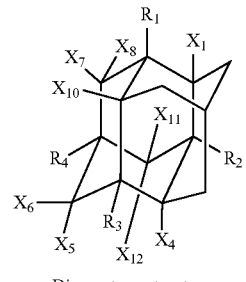

Diamantane structure

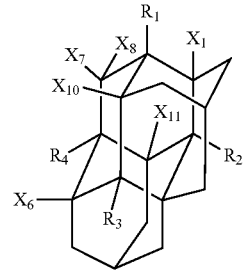

Triamantane structure

The following are specific examples of the compound represented by the formula (a) to be used in the invention, but the compound of the invention is not limited to them.

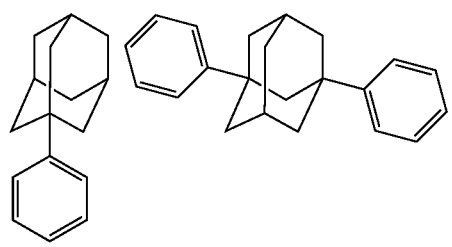

67
-continued
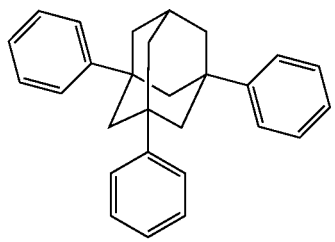
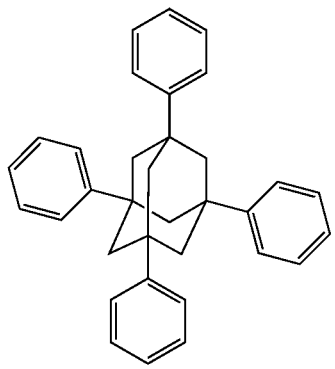
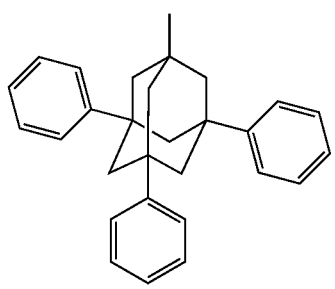
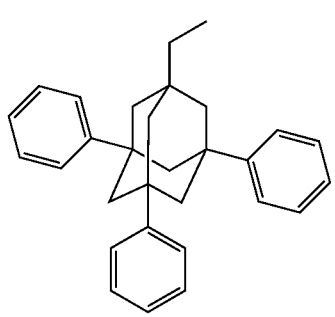
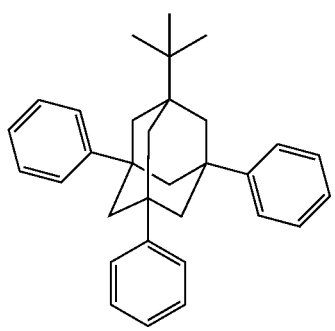
68
-continued
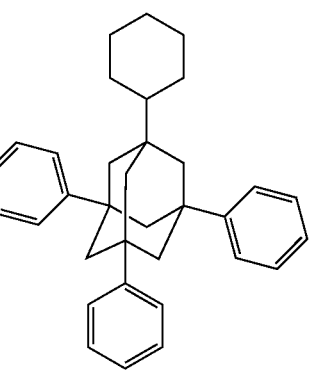
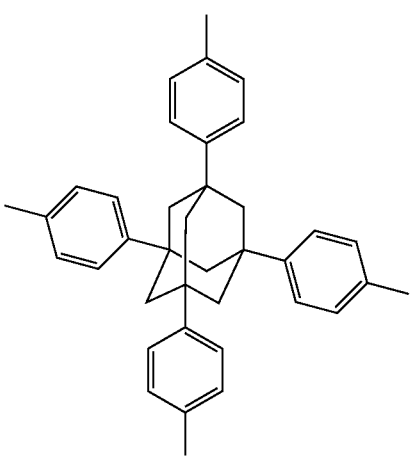
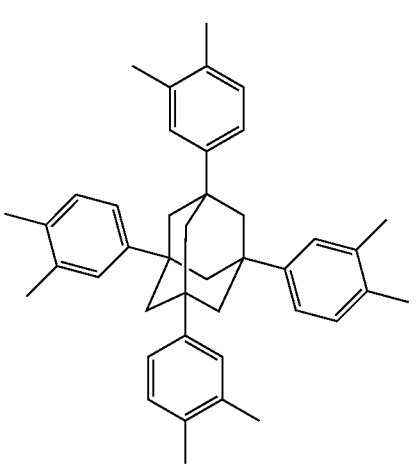

69
-continued
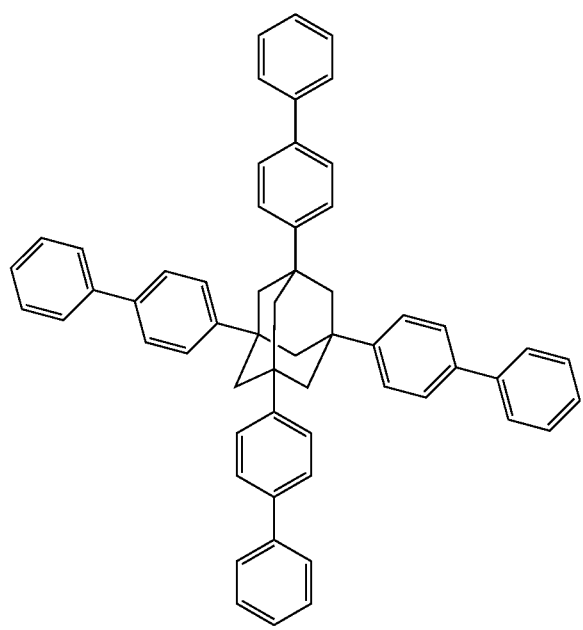
70
-continued
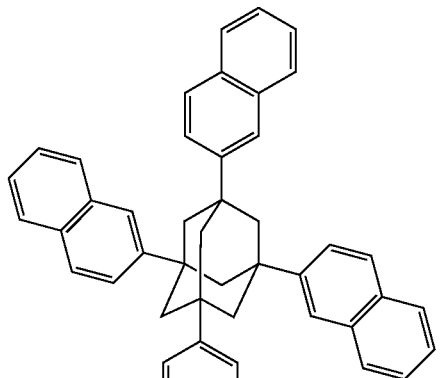
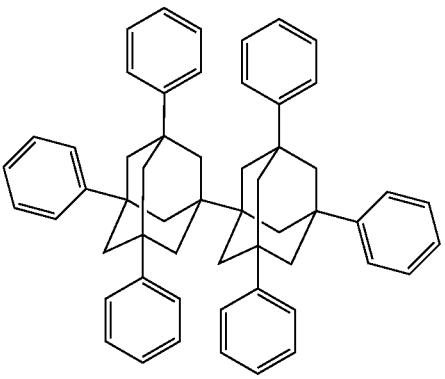
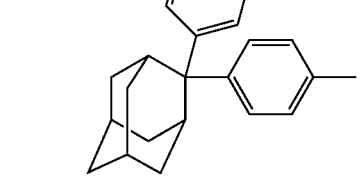
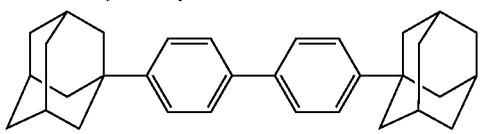
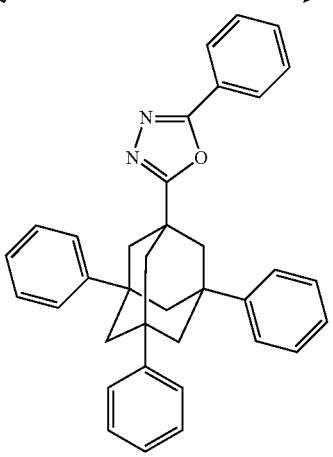

-continued

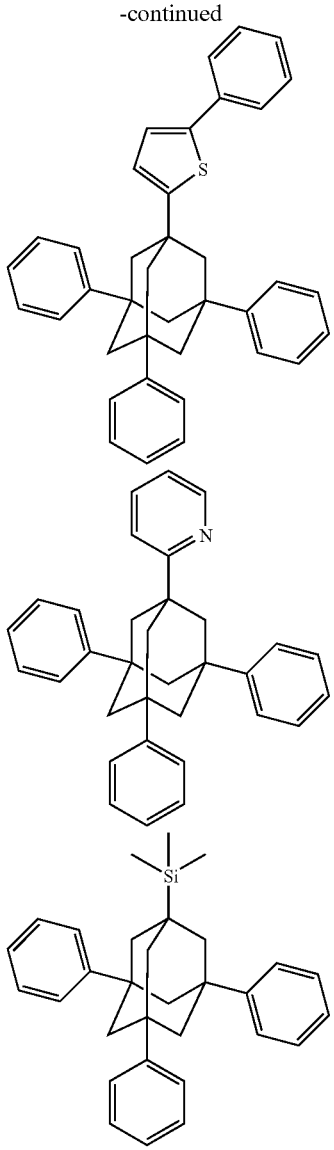

The compound represented by the formula (a) can be synthesized by using adamantane or a halogenated adamantane and an alkyl halide or an alkyl magnesium halide (Grignard reagent) in an appropriate combination. For example, a halogenated adamantane and an alkyl halide can be coupled by using indium (Document 1). An alkyl halide converted into an alkyl copper reagent can be coupled with a Grignard reagent of an aromatic compound (Document 2). Or, an alkyl halide and a proper arylboric acid can be coupled by using a palladium catalyst (Document 3).

Document 1: *Tetrahedron Lett.* 39, 9557-9558 (1998)
Document 2: *Tetrahedron Lett.* 39, 2095-2096 (1998)
Document 3: *J. Am. Chem. Soc.* 124, 13662-13663 (2002)

An aryl-containing adamantane skeleton can be synthesized by using adamantane or a halogenated adamantane and an arene or aryl halide corresponding to it in an appropriate combination.

In the above-described preparation process, when the defined substituent is changed under a condition of a certain synthesis process or is inadequate for carrying out the process, the compound can be prepared easily by means of protection, deprotection, or the like of a functional group (for example, *Protective Groups in Organic Synthesis*, written by T. W. Greene, John Wiley & Sons Inc. (1981), etc.). It is also possible to change the order of the reaction steps such as introduction of a substituent as needed.

Since the organic electroluminescent device is prepared using a vacuum vapor deposition process or a solution application process, the molecular weight of the compound represented by the formula (a) is preferably 2,000 or less, more preferably 1,200 or less, particularly preferably 1,000 or less from the viewpoint of vacuum deposition suitability and solubility. Also, from the viewpoint of vacuum deposition suitability, the molecular weight is preferably 250 or greater, more preferably 350 or greater, particularly preferably 400 or greater because when the molecular weight is too small, vapor pressure decreases and a change from a vapor phase to a solid phase does not occur, making it difficult to form an organic layer.

The compound represented by the formula (a) is used preferably in combination with the compound represented by the formula (I), more preferably in combination with the compound represented by the formula (I) and a platinum complex having a tetradentate ligand.

In the invention, the usage of the compound represented by the formula (a) in the invention is not limited and the compound may be contained in any of the organic layers. The layer into which the compound represented by the formula (a) in the invention is to be introduced is preferably any one or more of the light emitting layer described above and a hole injection layer, a hole transport layer, an electron transport layer, an electron injection layer, an exciton blocking layer, and a charge blocking layer which will be described later; more preferably any one or more of the light emitting layer, the hole injection layer, the hole transport layer, the electron transport layer, and the electron injection layer; particularly preferably the light emitting layer, the hole injection layer, and the hole transport layer; most preferably the light emitting layer.

The content of the compound represented by the formula (a) in the light emitting layer should be limited so as not to suppress the charge transporting property of a charge transporting material. The compound represented by the formula (a) in the invention is preferably contained in an amount of from 0.1 mass % to 70 mass %, more preferably from 0.1 mass % to 30 mass %, particularly preferably from 0.1 mass % to 25 mass %.

When the compound represented by the formula (a) is used in two or more organic layers, it is contained in each layer in an amount within the above-described range.

(Hole Injection Layer, Hole Transport Layer)

The hole injection layer and hole transport layer have a function of receiving holes from an anode or anode side and transporting them to a cathode side. The hole injection material and hole transporting material to be used for these layers may be either a low molecular compound or a high molecular compound.

(Electron Injection Layer, Electron Transport Layer)

The electron injection layer and electron transport layer are layers having a function of receiving electrons from a cathode or a cathode side and transporting them to an anode side. The electron injection material and electron transporting material to be used for these layers may be either a low molecular compound or a high molecular compound.

Detailed description on the hole injection layer, hole transport layer, electron injection layer, and electron transport layer, for example, in JP-A-2008-270736 and JP-A-2007-266458 can be applied to the invention.

(Hole Blocking Layer)

The hole blocking layer has a function of preventing holes, which have been transported from the anode side to the light emitting layer, from passing through to the cathode side. In the invention, the hole blocking layer can be provided as an organic layer adjacent to the light emitting layer on the cathode side.

Examples of compounds constituting the hole blocking layer include aluminum complexes such as aluminum (III) bis(2-methyl-8-quinolinato) 4-phenylphenolate (which will hereinafter be abbreviated as "BAlq"), triazole derivatives, and phenanthroline derivatives such as 2,9-dimethyl-4,7-diphenyl-1,10-phenanthroline (which will hereinafter be abbreviated as "BCP").

The thickness of the hole blocking layer is preferably from 1 nm to 500 nm, more preferably from 5 nm to 200 nm, still more preferably from 10 nm to 100 nm.

The hole blocking layer may have either a single layer structure composed of one or more materials selected from the above-exemplified materials or a multilayer structure composed of a plurality of layers having the same composition or different compositions.

(Electron Blocking Layer)

The electron blocking layer has a function of preventing the electrons, which have been transported from the cathode side to the light emitting layer, from passing through to the anode side. In the invention, the electron blocking layer can be provided as an organic layer adjacent to the light emitting layer on the anode side.

As the compound constituting the electron blocking layer, those exemplified above as the hole transporting materials can be used.

The thickness of the electron blocking layer is preferably from 1 nm to 500 nm, more preferably from 5 nm to 200 nm, still more preferably from 10 nm to 100 nm.

The electron blocking layer may have either a single layer structure composed of one or more materials selected from the above-exemplified materials or a multilayer structure composed of a plurality of layers having the same composition or different compositions.

(Protective Layer)

In the invention, the entirety of the organic EL device may be protected with a protective layer.

Any material is usable as the material to be contained in the protective layer insofar as it has a function of preventing penetration, into the device, of a substance such as water or oxygen that accelerates deterioration of the device.

The detailed description on the protective layer, for example, in JP-A-2008-270736 and JP-A-2007-266458 can also be applied to the invention.

(Sealing)

The entirety of the device of the invention may be sealed with a sealing container.

Further, a water absorber or an inert liquid may be enclosed in a space between the sealing container and the electroluminescent device. Although no particular limitation is imposed on the water absorber, examples of it include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieves, zeolite, and magnesium oxide. Although no particular limitation is imposed on the inert liquid, examples include paraffins, liquid paraffins, fluorine solvents such as perfluoroalkane, perfluoroamine, and perfluoroether, chlorine solvents, and silicone oils.

The device of the invention can emit light by applying a DC (it may contain AC component, if necessary) voltage (typically, from 2 volts to 15 volts) or a DC current between the anode and the cathode.

As a driving method of the device of the invention, usable are driving methods described in JP-A-2-148687, JP-A-6-301355/1994, JP-A-5-29080, JP-A-7-134558, JP-A-8-234685, and JP-A-8-241047, Japanese Patent No. 2784615, and U.S. Pat. Nos. 5,828,429 and 6,023,308.

The organic electroluminescent device of the invention can be used suitably in display devices, displays, backlights, electrophotography, illumination light sources, recording light sources, exposure light sources, reading light sources, indicators, signboards, interior designs, optical communications, and the like.

EXAMPLES

The present invention will next be described more specifically by Examples, but it is not limited to them.

Synthesis Example

Synthesis Example 1

Synthesis of Exemplified compound A-1

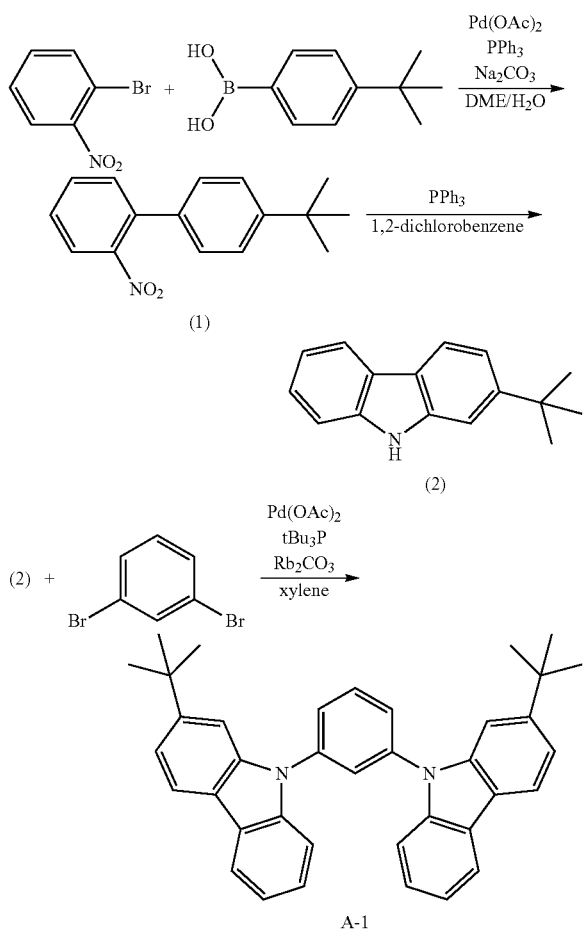

A-1

-continued

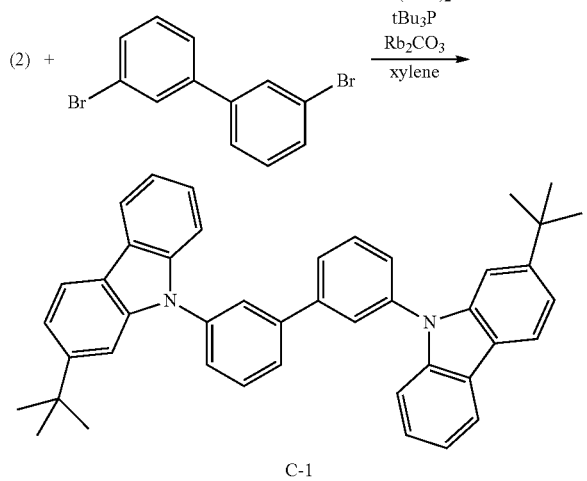

C-1

Under nitrogen, a three-necked flask was charged with 10.10 g of 2-bromonitrobenzene, 8.90 g of 4-tert-butylphenylboronic acid, 0.26 g of palladium acetate, 1.31 g of phosphine, 26.5 g of sodium carbonate, 250 ml of 1,2-dimethoxyethane, and 250 ml of pure water. The resulting mixture was stirred for 8 hours under heating and refluxing. Water was added to the reaction mixture, followed by extraction with ethyl acetate. The oil layer thus obtained was concentrated by using an evaporator and the residue was purified by a silica gel column to yield 12.1 g (yield: 94%) of a target compound (1).

$^1$H-NMR (300 MHz, in CDCl$_3$): δ (ppm)=1.35 (s, 9H), 7.24-7.27 (m, 2H), 7.41-7.48 (m, 4H), 7.59 (dt, 1H), 7.81 (dd, 1H)

Under nitrogen, a three-necked flask was charged with 10.21 g of Compound (1), 26.23 g of triphenylphosphine, and 70 ml of 1,2-dichlorobenzene. The resulting mixture was stirred for 24 hours under heating and refluxing. Water was added to the reaction mixture, followed by extraction with ethyl acetate. The oil layer thus obtained was concentrated by using an evaporator. The residue was purified by a silica gel column to yield 4.9 g (yield: 54%) of a target compound (2).

$^1$H-NMR (300 MHz, in DMSO-d6): δ (ppm)=1.35 (s, 9H), 7.11 (t, 1H), 7.23 (d, 1H), 7.33 (t, 1H), 7.43 (s, 1H), 7.45 (d, 1H), 7.99 (d, 1H), 8.04 (d, 1H).

Under nitrogen, a three-necked flask was charged with 4.91 g of Compound (2), 2.35 g of m-dibromobenzene, 0.18 g of palladium acetate, 9.24 g of rubidium carbonate, and 100 ml of xylene. Then, 0.64 g of tri-tert-butylphosphine was added. The resulting mixture was stirred for 8 hours under heating and refluxing. Water was added to the reaction mixture, followed by extraction with ethyl acetate. The oil layer thus obtained was concentrated using an evaporator. The residue was purified by a silica gel column to yield 3.90 g (yield: 75%) of a target compound A-1.

$^1$H-NMR (300 MHz, in DMSO-d6): δ (ppm)=1.44 (s, 18H), 7.27 (t, 2H), 7.36 (d, 2H), 7.46-7.53 (m, 2H), 7.78-7.82 (m, 2H), 7.83 (t, 2H), 7.97 (d, 2H), 8.02 (s, 2H), 8.14 (d, 2H), 8.19 (d, 2H).

Synthesis Example 2

Synthesis of Exemplified Compound C-1

Under nitrogen, a three-necked flask was charged with 4.91 g of Compound (2), 3.12 g of 3,3'-dibromobiphenyl, 0.18 g of palladium acetate, 9.24 g of rubidium carbonate, and 100 ml of xylene. Then, 0.64 g of tri-tert-butylphosphine was added. The resulting mixture was stirred for 8 hours under heating and refluxing. Water was added to the reaction mixture, followed by extraction with ethyl acetate. The oil layer thus obtained was concentrated by using an evaporator. The residue was purified by silica gel column to yield 3.87 g (yield: 65%) of a target compound C-1.

$^1$H-NMR (300 MHz, in DMSO-d6): δ (ppm)=1.24 (s, 18H), 7.26 (t, 2H), 7.37 (d, 2H), 7.39 (d, 2H), 7.41 (s, 2H), 7.46 (d, 2H), 7.69 (d, 2H), 7.83 (t, 2H), 7.97 (d, 2H), 8.02 (s, 2H), 8.4 (d, 2H), 8.19 (d, 2H).

Organic Electroluminescent Device

Example 1

[Preparation of Comparative Device C-1]

A 0.5 mm-thick and 2.5-cm square glass substrate (product of Geomatec, surface resistance: 10Ω/□) having an ITO film thereon was put in a cleaning container. After ultrasonic cleaning in 2-propanol, the resulting glass substrate was subjected to UV-ozone treatment for 30 minutes. The following organic compound layers were successively deposited by vacuum deposition on the transparent anode (ITO film) thus obtained.

A deposition rate in Examples of the invention is 0.2 nm/sec unless otherwise specifically indicated. The deposition rate was measured using a quartz oscillator. The film thicknesses described below were also measured using the quartz oscillator.

First layer: HI-1 and F4TCNQ (not described in tables) (at a weight ratio of 99:1), film thickness: 120 nm
Second layer: HT-1, film thickness: 7 nm
Third layer: HT-4, film thickness: 3 nm
Fourth layer (light emitting layer): Light emitting material A and Comparative compound 1 (at a weight ratio of 15:85), film thickness: 30 nm
Fifth layer: ET-3, film thickness: 29 nm
Sixth layer: EI-1, film thickness: 1 nm On these organic compound layers, 0.1 nm of lithium fluoride and 100 nm of metal aluminum were deposited in the order of mention to form a cathode.

The resulting product was put in a glove box purged with a nitrogen gas without bringing it into contact with the atmosphere and then sealed with a sealing can made of glass and an ultraviolet curing adhesive ("XNR5516HV", product of Nagase-CIBA).

[Preparation of Comparative Devices C2-1 to C12-1 and Invention Devices 1-1 to 12-5]

In a similar manner to that employed for the preparation of Comparative device C1-1 except that the constitution of each layer was changed to that listed in Table 1, Comparative device C1-2 and Invention devices 1-1 to 1-7 were prepared and evaluated. The resulting devices provided phosphorescence derived from the light emitting materials used for them. The results are shown collectively in Tables 1 to 12.

(Evaluation of Performance of Organic Electroluminescent Device)

(a) Running Durability

A DC voltage was applied to each device to give its luminance of 1000 cd/m$^2$ and time necessary for the luminance to be reduced to 500 cd/m$^2$ was measured. The time necessary for the luminance to be reduced by half was used as an indicator for evaluation of running durability.

(b) Drive Voltage

A DC voltage was applied to each device to give its luminance of 1000 cd/m$^2$ and the device was caused to emit light. The voltage applied to the device was used as an indicator for evaluation of the drive voltage.

The results are shown collectively in Tables 1 to 12 as a relative value.

TABLE 1

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C1-1 | HI-1 | HT-1 | HT-4 | A | Comparative compound 1 | ET-3 | EI-1 | 1.00 | 1.00 |
| 1-1 | HI-1 | HT-1 | HT-4 | A | A-1 | ET-3 | EI-1 | 0.66 | 2.01 |
| 1-2 | HI-1 | HT-1 | HT-4 | A | A-2 | ET-3 | EI-1 | 0.61 | 1.17 |
| 1-3 | HI-1 | HT-1 | HT-4 | A | A-4 | ET-3 | EI-1 | 0.69 | 1.39 |
| 1-4 | HI-1 | HT-1 | HT-4 | A | B-1 | ET-3 | EI-1 | 0.64 | 1.17 |
| 1-5 | HI-1 | HT-1 | HT-4 | A | B-2 | ET-3 | EI-1 | 0.64 | 1.15 |
| 1-6 | HI-1 | HT-1 | HT-4 | A | B-4 | ET-3 | EI-1 | 0.69 | 1.10 |
| 1-7 | HI-1 | HT-1 | HT-4 | A | A-1/H-1 | ET-3 | EI-1 | 0.63 | 2.12 |
| 1-8 | HI-1 | HT-1 | HT-4 | A | E-3 | ET-3 | EI-1 | 0.65 | 2.73 |

TABLE 2

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C2-1 | HI-2 | HT-2 | HT-4 | A | Comparative compound 2 | ET-3 | EI-1 | 1.00 | 1.00 |
| 2-1 | HI-2 | HT-2 | HT-4 | A | A-5 | ET-3 | EI-1 | 0.67 | 3.13 |
| 2-2 | HI-2 | HT-2 | HT-4 | A | A-6 | ET-3 | EI-1 | 0.67 | 3.25 |
| 2-3 | HI-2 | HT-2 | HT-4 | A | C-2 | ET-3 | EI-1 | 0.72 | 3.25 |
| 2-4 | HI-2 | HT-2 | HT-4 | A | C-3 | ET-3 | EI-1 | 0.72 | 3.07 |
| 2-5 | HI-2 | HT-2 | HT-4 | A | C-6 | ET-3 | EI-1 | 0.70 | 3.44 |
| 2-6 | HI-2 | HT-2 | HT-4 | A | C-7 | ET-3 | EI-1 | 0.67 | 3.62 |

TABLE 3

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C3-1 | HI-3 | HT-2 | HT-4 | A | Comparative compound 1 | ET-3 | EI-1 | 1.00 | 1.00 |
| 3-1 | HI-3 | HT-2 | HT-4 | A | C-1 | ET-3 | EI-1 | 0.69 | 2.08 |
| 3-2 | HI-3 | HT-2 | HT-4 | A | C-4 | ET-3 | EI-1 | 0.62 | 1.28 |
| 3-3 | HI-3 | HT-2 | HT-4 | A | C-5 | ET-3 | EI-1 | 0.69 | 1.18 |
| 3-4 | HI-3 | HT-2 | HT-4 | A | C-8 | ET-3 | EI-1 | 0.71 | 1.89 |
| 3-5 | HI-3 | HT-2 | HT-4 | A | C-9 | ET-3 | EI-1 | 0.72 | 1.25 |
| 3-6 | HI-3 | HT-2 | HT-4 | A | C-1/H-2 | ET-3 | E1-1 | 0.65 | 2.19 |
| 3-7 | HI-3 | HT-2 | HT-4 | A | F-4 | ET-3 | EI-1 | 0.67 | 2.86 |

TABLE 4

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C4-1 | HI-1 | HT-3 | HT-4 | B | Comparative compound 1 | ET-3 | EI-1 | 1.00 | 1.00 |
| 4-1 | HI-1 | HT-3 | HT-4 | B | A-1 | ET-3 | EI-1 | 0.72 | 1.86 |
| 4-2 | HI-1 | HT-3 | HT-4 | B | A-2 | ET-3 | EI-1 | 0.64 | 1.14 |

TABLE 4-continued

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| 4-3 | HI-1 | HT-3 | HT-4 | B | A-4 | ET-3 | EI-1 | 0.72 | 1.22 |
| 4-4 | HI-1 | HT-3 | HT-4 | B | B-1 | ET-3 | EI-1 | 0.69 | 1.08 |
| 4-5 | HI-1 | HT-3 | HT-4 | B | B-2 | ET-3 | EI-1 | 0.70 | 1.04 |
| 4-6 | HI-1 | HT-3 | HT-4 | B | B-4 | ET-3 | EI-1 | 0.72 | 1.08 |

TABLE 5

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C5-1 | HI-2 | HT-3 | HT-4 | B | Comparative compound 2 | ET-2 | EI-1 | 1.00 | 1.00 |
| 5-1 | HI-2 | HT-3 | HT-4 | B | A-5 | ET-2 | EI-1 | 0.67 | 2.91 |
| 5-2 | HI-2 | HT-3 | HT-4 | B | A-6 | ET-2 | EI-1 | 0.68 | 2.74 |
| 5-3 | HI-2 | HT-3 | HT-4 | B | C-2 | ET-2 | EI-1 | 0.69 | 2.91 |
| 5-4 | HI-2 | HT-3 | HT-4 | B | C-3 | ET-2 | EI-1 | 0.71 | 2.70 |
| 5-5 | HI-2 | HT-3 | HT-4 | B | C-6 | ET-2 | EI-1 | 0.67 | 2.83 |
| 5-6 | HI-2 | HT-3 | HT-4 | B | C-7 | ET-2 | EI-1 | 0.72 | 2.87 |

TABLE 6

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C6-1 | HI-3 | HT-2 | HT-4 | B | Comparative compound 1 | ET-3 | EI-1 | 1.00 | 1.00 |
| 6-1 | HI-3 | HT-2 | HT-4 | B | C-1 | ET-3 | EI-1 | 0.71 | 1.92 |
| 6-2 | HI-3 | HT-2 | HT-4 | B | C-4 | ET-3 | EI-1 | 0.63 | 1.06 |
| 6-3 | HI-3 | HT-2 | HT-4 | B | C-5 | ET-3 | EI-1 | 0.68 | 1.04 |
| 6-4 | HI-3 | HT-2 | HT-4 | B | C-8 | ET-3 | EI-1 | 0.73 | 1.69 |
| 6-5 | HI-3 | HT-2 | HT-4 | B | C-9 | ET-3 | EI-1 | 0.72 | 1.16 |

TABLE 7

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C7-1 | HI-1 | TH-1 | HT-4 | C | Comparative compound 2 | ET-3 | EI-1 | 1.00 | 1.00 |
| 7-1 | HI-1 | TH-1 | HT-4 | C | A-1 | ET-3 | EI-1 | 0.68 | 1.80 |
| 7-2 | HI-1 | TH-1 | HT-4 | C | A-2 | ET-3 | EI-1 | 0.63 | 1.10 |
| 7-3 | HI-1 | TH-1 | HT-4 | C | A-4 | ET-3 | EI-1 | 0.74 | 1.19 |
| 7-4 | HI-1 | TH-1 | HT-4 | C | B-1 | ET-3 | EI-1 | 0.68 | 1.07 |
| 7-5 | HI-1 | TH-1 | HT-4 | C | B-2 | ET-3 | EI-1 | 0.65 | 1.04 |
| 7-6 | HI-1 | TH-1 | HT-4 | C | B-4 | ET-3 | EI-1 | 0.69 | 1.06 |
| 7-7 | HI-1 | TH-1 | HT-4 | C | A-1/H-1 | ET-3 | EI-1 | 0.65 | 2.03 |

TABLE 8

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C8-1 | HI-2 | HT-2 | HT-4 | C | Comparative compound 2 | ET-3 | EI-1 | 1.00 | 1.00 |
| 8-1 | HI-2 | HT-2 | HT-4 | C | A-5 | ET-3 | EI-1 | 0.67 | 2.65 |
| 8-2 | H1-2 | HT-2 | HT-4 | C | A-6 | ET-3 | EI-1 | 0.65 | 2.78 |
| 8-3 | H1-2 | HT-2 | HT-4 | C | C-2 | ET-3 | EI-1 | 0.70 | 2.67 |
| 8-4 | H1-2 | HT-2 | HT-4 | C | C-3 | ET-3 | EI-1 | 0.69 | 2.59 |
| 8-5 | H1-2 | HT-2 | HT-4 | C | C-6 | ET-3 | EI-1 | 0.67 | 2.51 |
| 8-6 | H1-2 | HT-2 | HT-4 | C | C-7 | ET-3 | EI-1 | 0.69 | 2.26 |

TABLE 9

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C9-1 | HI-3 | HT-2 | HT-4 | C | Comparative compound 2 | ET-3 | EI-1 | 1.00 | 1.00 |
| 9-1 | HI-3 | HT-2 | HT-4 | C | C-1 | ET-3 | EI-1 | 0.72 | 1.95 |
| 9-2 | HI-3 | HT-2 | HT-4 | C | C-4 | ET-3 | EI-1 | 0.62 | 1.10 |
| 9-3 | HI-3 | HT-2 | HT-4 | C | C-5 | ET-3 | EI-1 | 0.71 | 1.12 |
| 9-4 | HI-3 | HT-2 | HT-4 | C | C-8 | ET-3 | EI-1 | 0.72 | 1.20 |
| 9-5 | HI-3 | HT-2 | HT-4 | C | C-9 | ET-3 | EI-1 | 0.72 | 1.12 |
| 9-6 | HI-3 | HT-2 | HT-4 | C | C-1/H-2 | ET-3 | EI-1 | 0.69 | 2.07 |

TABLE 10

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C10-1 | HI-1 | HT-3 | HT-4 | D | Comparative compound 1 | ET-3 | EI-1 | 1.00 | 1.00 |
| 10-1 | HI-1 | HT-3 | HT-4 | D | A-1 | ET-3 | EI-1 | 0.77 | 1.37 |
| 10-2 | HI-1 | HT-3 | HT-4 | D | A-2 | ET-3 | EI-1 | 0.71 | 1.07 |
| 10-3 | HI-1 | HT-3 | HT-4 | D | A-4 | ET-3 | EI-1 | 0.74 | 1.18 |
| 10-4 | HI-1 | HT-3 | HT-4 | D | B-1 | ET-3 | EI-1 | 0.74 | 1.06 |
| 10-5 | HI-1 | HT-3 | HT-4 | D | B-2 | ET-3 | EI-1 | 0.70 | 1.02 |
| 10-6 | HI-1 | HT-3 | HT-4 | D | B-4 | ET-3 | EI-1 | 0.73 | 1.04 |

TABLE 11

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C11-1 | HI-2 | HT-3 | HT-4 | D | Comparative compound 2 | ET-1 | EI-1 | 1.00 | 1.00 |
| 11-1 | HI-2 | HT-3 | HT-4 | D | A-5 | ET-1 | EI-1 | 0.71 | 2.48 |
| 11-2 | HI-2 | HT-3 | HT-4 | D | A-6 | ET-1 | EI-1 | 0.73 | 2.44 |
| 11-3 | HI-2 | HT-3 | HT-4 | D | C-2 | ET-1 | EI-1 | 0.76 | 2.32 |
| 11-4 | HI-2 | HT-3 | HT-4 | D | C-3 | ET-1 | EI-1 | 0.78 | 2.21 |
| 11-5 | HI-2 | HT-3 | HT-4 | D | C-6 | ET-1 | EI-1 | 0.76 | 2.04 |
| 11-6 | HI-2 | HT-3 | HT-4 | D | C-7 | ET-1 | EI-1 | 0.78 | 2.09 |

TABLE 12

| Device | First layer | Second layer | Third layer | Fourth layer Light emitting material | Fourth layer Host material | Fifth layer | Sixth layer | Relative drive voltage | Relative durability |
|---|---|---|---|---|---|---|---|---|---|
| C12-1 | HI-3 | HT-2 | HT-4 | D | Comparative compound 1 | ET-1 | EI-1 | 1.00 | 1.00 |
| 12-1 | HI-3 | HT-2 | HT-4 | D | C-1 | ET-1 | EI-1 | 0.74 | 1.51 |
| 12-2 | HI-3 | HT-2 | HT-4 | D | C-4 | ET-1 | EI-1 | 0.77 | 1.09 |
| 12-3 | HI-3 | HT-2 | HT-4 | D | C-5 | ET-1 | EI-1 | 0.76 | 1.07 |
| 12-4 | HI-3 | HT-2 | HT-4 | D | C-8 | ET-1 | EI-1 | 0.77 | 1.18 |
| 12-5 | HI-3 | HT-2 | HT-4 | D | C-9 | ET-1 | EI-1 | 0.74 | 1.06 |

As is apparent from the above results, the devices according to the invention are excellent in running durability and very excellent in durability compared with the comparative devices.

The structures of the compounds used in Examples are shown below.

Comparative compound

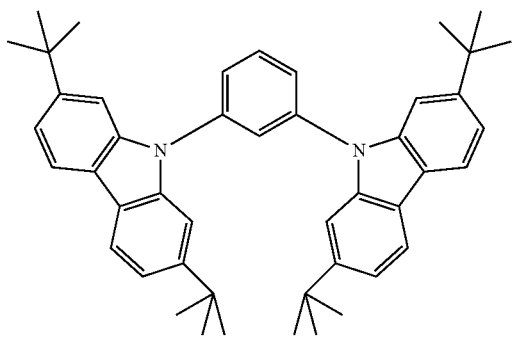

Comparative compound 1

Compound described in JP-A-2008-085079

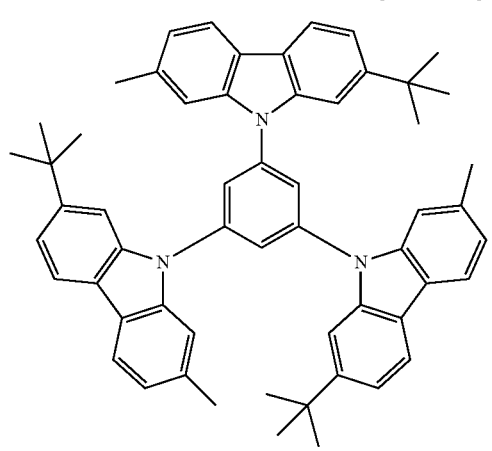

Comparative compound 2

Compound described in JP-A-2003-335754

Blue phosphorescent material

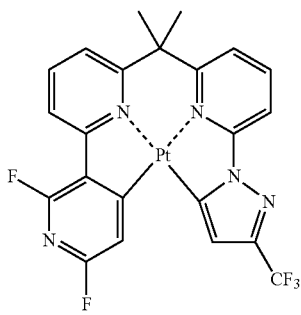

Light emitting material A

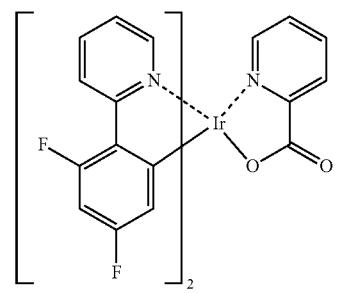

Light emitting material B

Green phosphorescent material

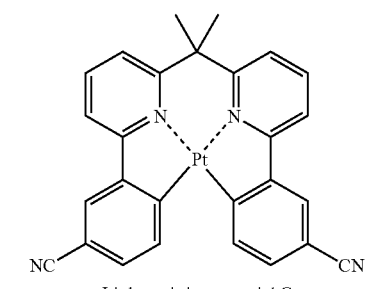 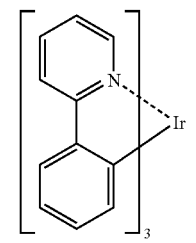

Light emitting material C    Light emitting material D

HI-1
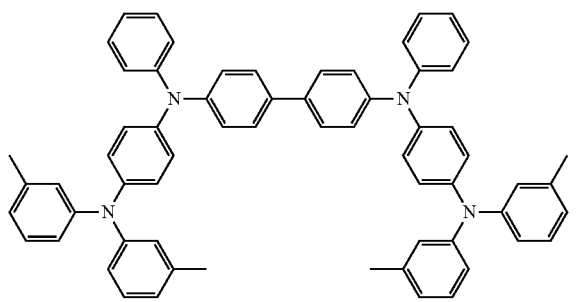
HI-2
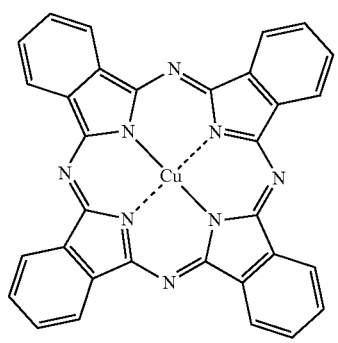
HI-3
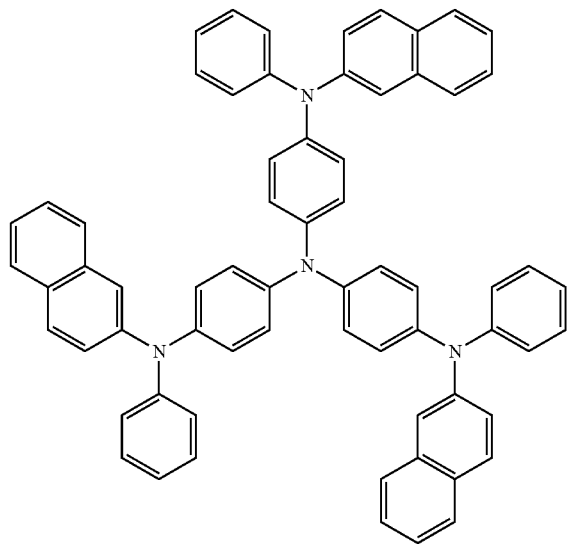
HT-1
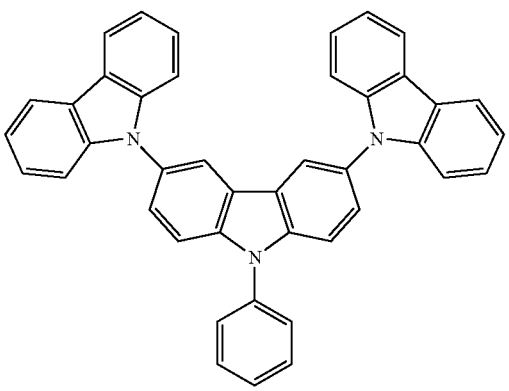
HT-2
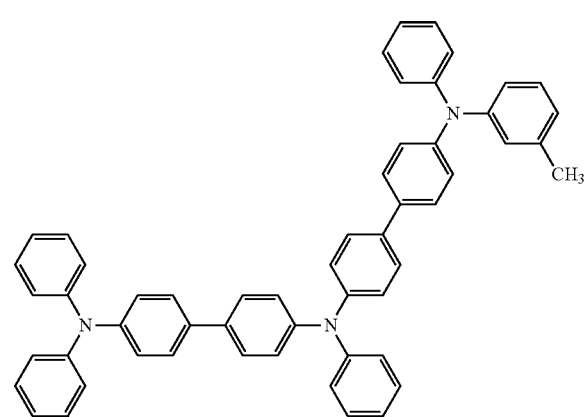
F4-TCNQ
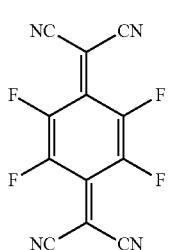
HT-3
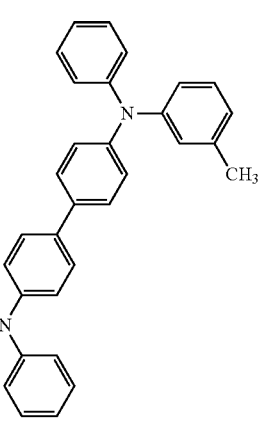
HT-4
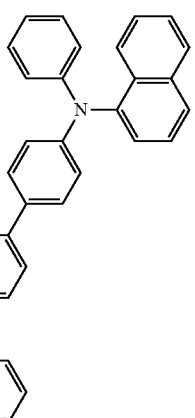

87
-continued

H-1
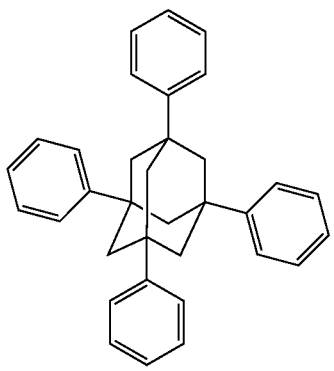

H-2
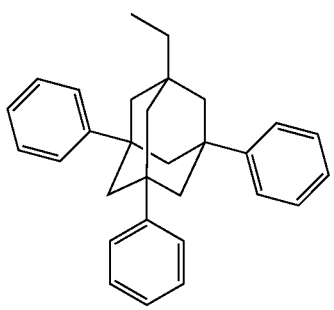

ET-1
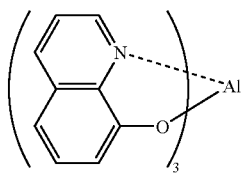

ET-2
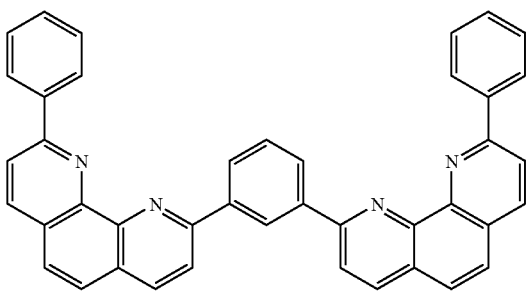

ET-3
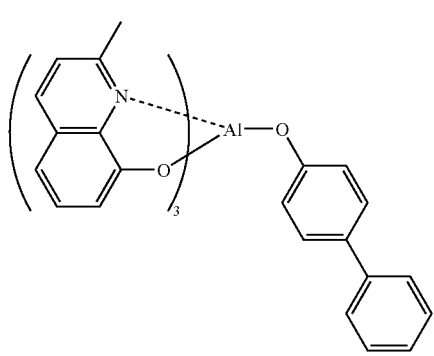

88
-continued

EI-1
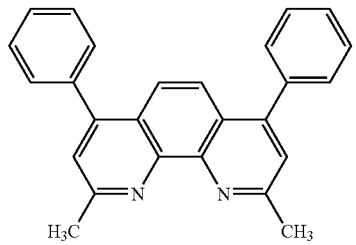

What is claimed is:
1. An organic electroluminescent device comprising:
   a pair of electrodes; and
   at least one organic layer between the pair of electrodes, the at least one organic layer including a light emitting layer,
   the device comprising, in the at least one organic layer, a compound represented by formula (I):

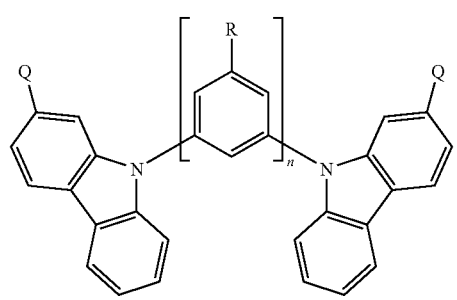

(I)

wherein Qs each independently represents a t-butyl group or a trimethylsilyl group; R represents a hydrogen atom, an alkyl group, a cyano group, an aryl group, or a heteroaryl group, and when the compound has a plurality of Rs, the Rs each independently represents a hydrogen atom, an alkyl group, a cyano group, an aryl group, or a heteroaryl group; and n stands for 1 or 2,
wherein the light emitting layer includes a platinum complex material, and
wherein the light emitting layer further contains a compound represented by formula (a):

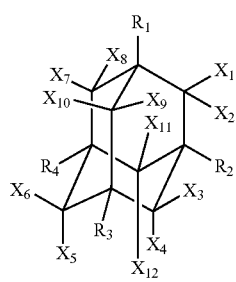

(a)

wherein $R_1$ to $R_4$ each independently represents a hydrogen atom, an alkyl group, an alkenyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group, and at least one of $R_1$ to $R_4$ represents a group with a double bond or a triple bond; and $X_1$ to $X_{12}$ each independently represents a hydrogen atom, an alkyl group, an alkynyl group, an aryl group, a heteroaryl group, an alkoxy group, an acyl group, an acyloxy group, an amino group, a nitro group, a cyano group, an ester group, an amide group, a halogen group, a perfluoroalkyl group, or a silyl group.

2. The organic electroluminescent device according to claim 1, wherein the
compound represented by formula (I) is a compound represented by formula (II):

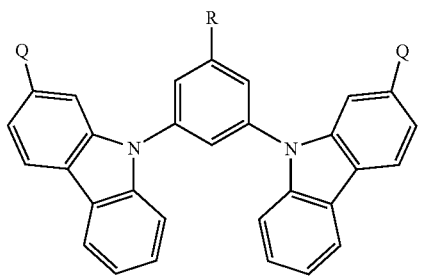

(II)

wherein Qs each independently represents a t-butyl group or a trimethylsilyl group and R represents a hydrogen atom, an alkyl group, a cyano group, an aryl group, or a heteroaryl group.

3. The organic electroluminescent device according to claim 2, wherein the compound represented by formula (II) is a compound represented by formula (III):

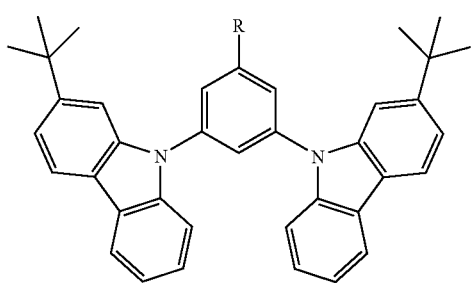

(III)

wherein R represents a hydrogen atom, an alkyl group, a cyano group, an aryl group, or a heteroaryl group.

4. The organic electroluminescent device according to claim 1, wherein the compound represented by formula (I) is a compound represented by formula (IV):

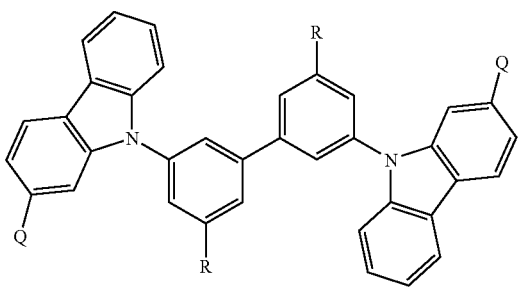

(IV)

wherein Qs each independently represents a t-butyl group or a trimethylsilyl group and Rs each independently represents a hydrogen atom, an alkyl group, a cyano group, an aryl group, or a heteroaryl group.

5. The organic electroluminescent device according to claim 4, wherein the compound represented by formula (IV) is a compound represented by formula (V):

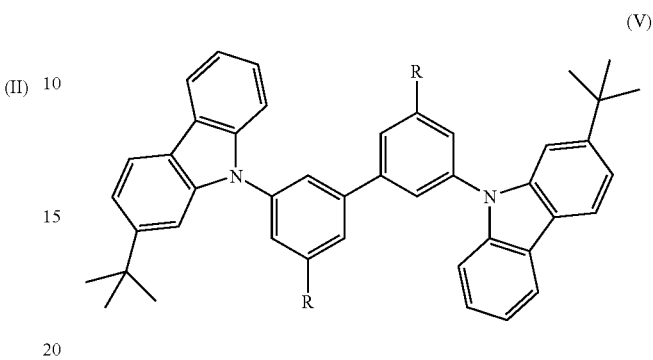

(V)

wherein Rs each independently represents a hydrogen atom, an alkyl group, a cyano group, an aryl group, or a heteroaryl group.

6. The organic electroluminescent device according to claim 3, wherein R in formula (III) represents a hydrogen atom, a phenyl group, or a carbazole group.

7. The organic electroluminescent device according to claim 5, wherein R in formula (V) represents a hydrogen atom, a phenyl group, or a carbazole group.

8. The organic electroluminescent device according to claim 1, wherein the compound represented by formula (I) has a $T_1$ energy of 61 kcal/mol or greater.

9. The organic electroluminescent device according to claim 1, wherein the compound represented by formula (I) has a molecular weight of from 450 to 1200.

10. The organic electroluminescent device according to claim 1, wherein the platinum complex material has a tetradentate ligand.

11. The organic electroluminescent device according to claim 10, wherein the platinum complex material is represented by formula (2a-1):

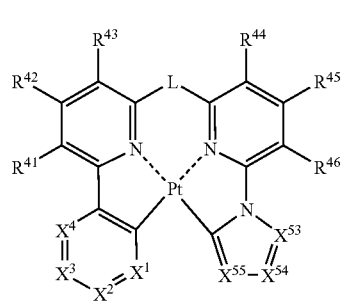

(2a-1)

wherein $X^1$, $X^2$, $X^3$, and $X^4$ each independently represents a carbon atom or a nitrogen atom and any one or more of $X^1$, $X^2$, $X^3$, and $X^4$ represent a nitrogen atom; $R^{41}$, $R^{42}$, $R^{43}$, $R^{44}$, $R^{45}$, and $R^{46}$ each independently represents a hydrogen atom or a substituent; $X^{53}$, $X^{54}$, and $X^{55}$ each independently represents a carbon atom or a nitrogen atom and the number of nitrogen atoms contained in a 5-membered ring skeleton containing $X^{53}$, $X^{54}$, and $X^{55}$ is 1 or 2; and L represents a single bond or a divalent linking group.

* * * * *